(12) United States Patent
Hachiya et al.

(10) Patent No.: US 9,978,505 B2
(45) Date of Patent: *May 22, 2018

(54) PRINTED CIRCUIT BOARD WITH INTEGRATED COIL, AND MAGNETIC DEVICE

(71) Applicant: OMRON AUTOMOTIVE ELECTRONICS CO., LTD., Aichi (JP)

(72) Inventors: Koji Hachiya, Hyoto (JP); Tomoyoshi Kobayashi, Aichi (JP); Koichi Nakabayashi, Kyoto (JP)

(73) Assignee: OMRON AUTOMOTIVE ELECTRONICS CO., LTD., Aichi (JP)

( * ) Notice: Subject to any disclaimer, the term of this patent is extended or adjusted under 35 U.S.C. 154(b) by 135 days.

This patent is subject to a terminal disclaimer.

(21) Appl. No.: 14/777,399

(22) PCT Filed: Mar. 10, 2014

(86) PCT No.: PCT/JP2014/001327
§ 371 (c)(1),
(2) Date: Sep. 15, 2015

(87) PCT Pub. No.: WO2014/141673
PCT Pub. Date: Sep. 18, 2014

(65) Prior Publication Data
US 2016/0035481 A1    Feb. 4, 2016

(30) Foreign Application Priority Data
Mar. 15, 2013  (JP) .................................. 2013-053552
Oct. 30, 2013  (JP) .................................. 2013-225339

(51) Int. Cl.
*H01F 27/08*   (2006.01)
*H01F 27/02*   (2006.01)
(Continued)

(52) U.S. Cl.
CPC ......... *H01F 27/2876* (2013.01); *H01F 27/22* (2013.01); *H01F 27/2804* (2013.01);
(Continued)

(58) Field of Classification Search
USPC ...................................................... 336/55–61
See application file for complete search history.

(56) References Cited

U.S. PATENT DOCUMENTS 5,777,539 A * 7/1998 Folker ................ H01F 27/2804
336/200
5,929,733 A   7/1999 Anzawa et al.
(Continued)

FOREIGN PATENT DOCUMENTS

JP  H07-38262 A   2/1995
JP  H07-86755 A   3/1995
(Continued)

OTHER PUBLICATIONS

International Search Report issued in PCT/JP2014/001327 dated Jun. 17, 2014 (2 pages).
(Continued)

*Primary Examiner* — Elvin G Enad
*Assistant Examiner* — Kazi Hossain
(74) *Attorney, Agent, or Firm* — Osha Liang LLP

(57) ABSTRACT

A printed circuit board with integrated coil includes: a plurality of layers; and coil patterns which are formed of a conductor and which are provided in at least one outer surface layer and another layer of the plurality of layers. A heat-dissipation pattern formed of a conductor is provided on at least the one outer surface layer so as to correspond to
(Continued)

the coil pattern provided in the another layer. The coil pattern provided in the one outer surface layer and the heat-dissipation pattern provided in the one outer surface layer are separated from each other. A thermal inter-layer connector formed of a conductor is provided to connect the coil pattern provided in the another layer and the heat-dissipation pattern provided in the one outer surface layer which correspond to each other.

10 Claims, 9 Drawing Sheets

(51) Int. Cl.
  H01F 27/28      (2006.01)
  H01F 27/22      (2006.01)
  H01F 37/00      (2006.01)
  H05K 1/16       (2006.01)
  H05K 1/02       (2006.01)
  H05K 3/00       (2006.01)
(52) U.S. Cl.
  CPC ............. *H01F 37/00* (2013.01); *H05K 1/165* (2013.01); *H01F 2027/2819* (2013.01); *H05K 1/0204* (2013.01); *H05K 1/0263* (2013.01); *H05K 3/0061* (2013.01); *H05K 2201/086* (2013.01); *H05K 2201/10409* (2013.01); *H05K 2201/10416* (2013.01)

(56) References Cited

U.S. PATENT DOCUMENTS

| | | | | |
|---|---|---|---|---|
| 6,000,128 | A * | 12/1999 | Umeno | H01F 27/2804 29/605 |
| 7,256,676 | B2 * | 8/2007 | Poynton | H01F 17/0013 29/602.1 |
| 2003/0174037 | A1 * | 9/2003 | Hooey | H01F 27/266 336/61 |
| 2004/0178876 | A1 * | 9/2004 | Koizumi | H01F 17/0033 336/200 |
| 2005/0270745 | A1 * | 12/2005 | Chen | H01F 27/2804 361/707 |
| 2008/0197960 | A1 * | 8/2008 | Hasegawa | H01F 27/2871 336/110 |
| 2010/0164670 | A1 | 7/2010 | Nakahori et al. | |
| 2011/0102121 | A1 | 5/2011 | Otsuka et al. | |
| 2012/0112866 | A1 | 5/2012 | Matsumoto | |
| 2012/0161911 | A1 * | 6/2012 | Moiseev | H01F 27/2804 336/55 |
| 2013/0278373 | A1 * | 10/2013 | Hara | H01F 5/003 336/200 |
| 2014/0070763 | A1 * | 3/2014 | Chiles | H01F 38/14 320/108 |

FOREIGN PATENT DOCUMENTS

| | | |
|---|---|---|
| JP | H08-69935 A | 3/1996 |
| JP | 2007-059839 A | 3/2007 |
| JP | 2008-502293 A | 1/2008 |
| JP | 2008-177516 A | 7/2008 |
| JP | 2008-205350 A | 9/2008 |
| JP | 2010-153724 A | 7/2010 |
| JP | 2010-161258 A | 7/2010 |
| JP | 2013-062355 A | 4/2013 |
| WO | 2010/026690 A1 | 3/2010 |
| WO | 2011/010491 A1 | 1/2011 |

OTHER PUBLICATIONS

Written Opinion of the International Searching Authority issued in PCT/JP2014/001327 dated Jun. 17, 2014 (3 pages).
International Preliminary Report on Patentability from PCT/JP2014/001327 dated Mar. 26, 2015 (3 pages).

* cited by examiner

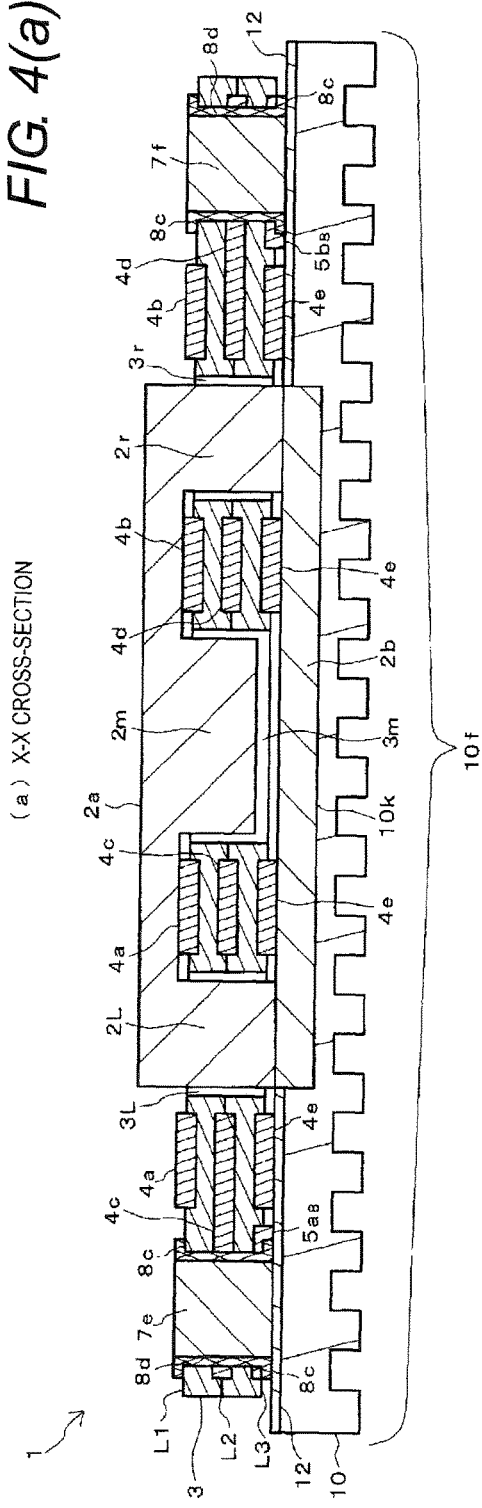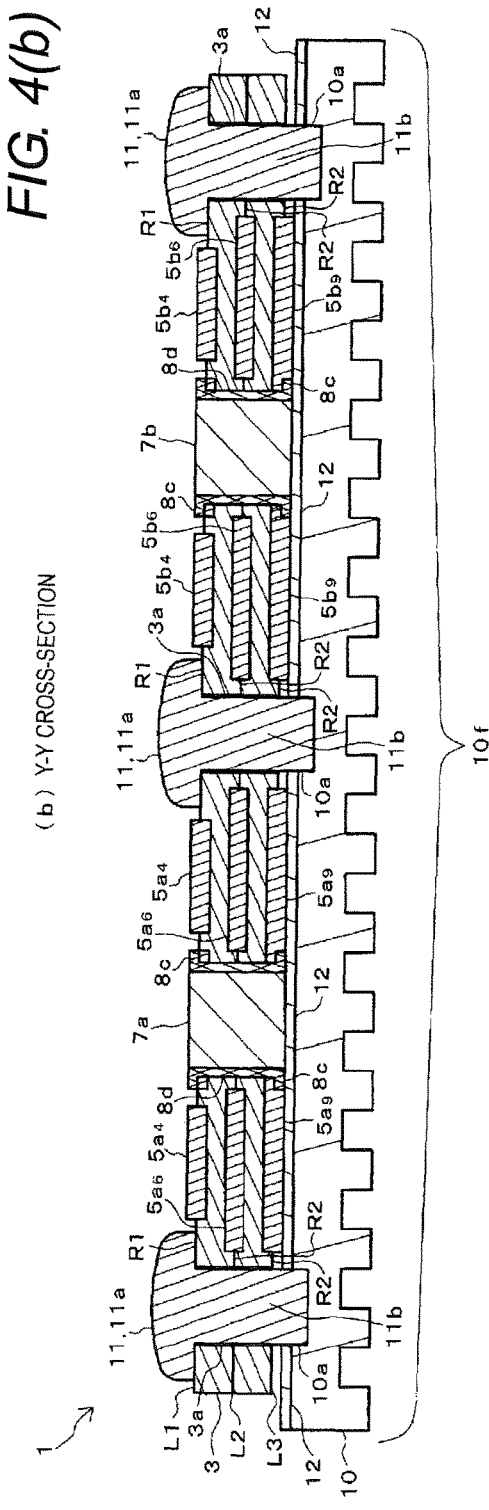

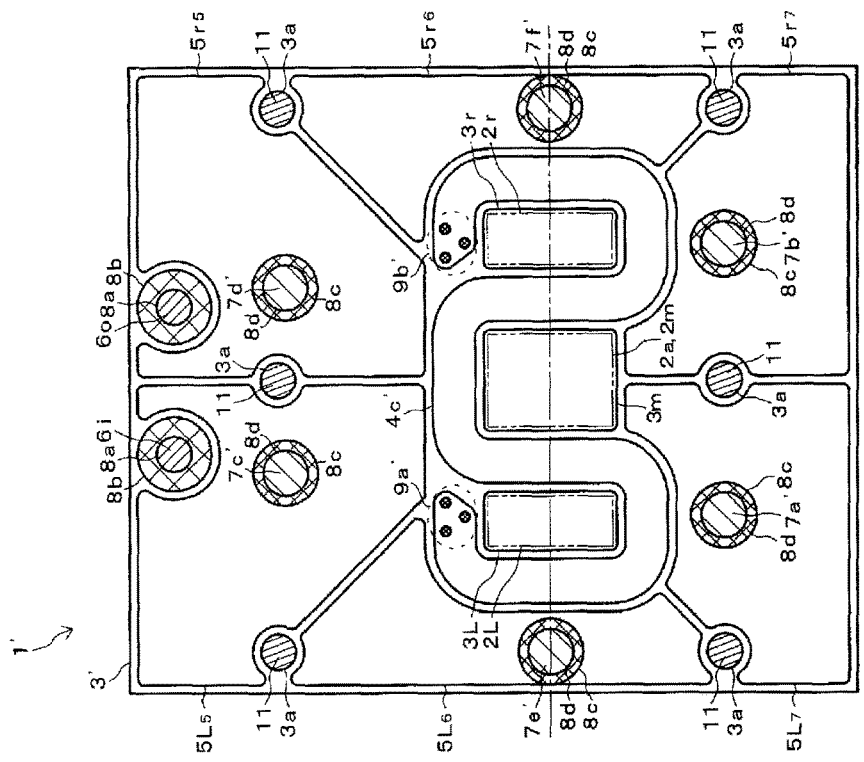
FIG. 5(a) FRONT-SIDE OUTER SURFACE LAYER L1'
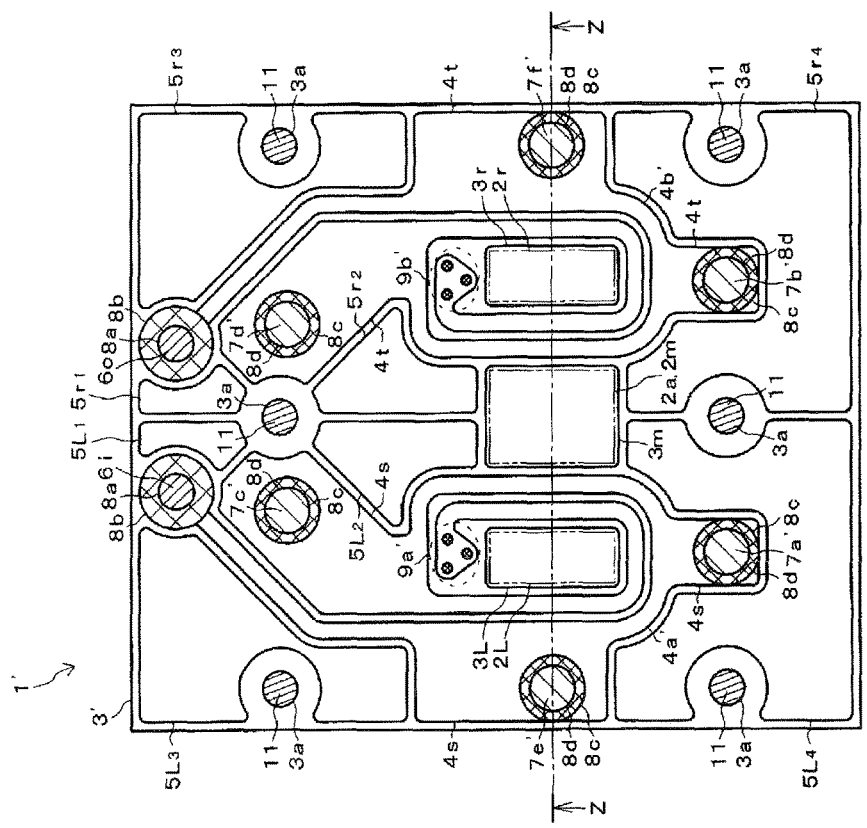
FIG. 5(b) BACK-SIDE OUTER SURFACE LAYER L2'

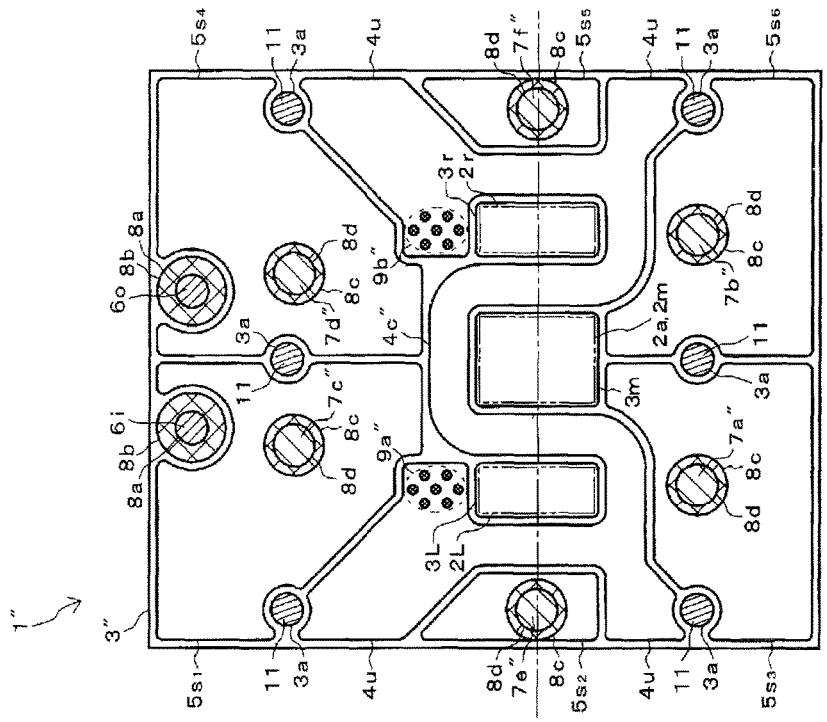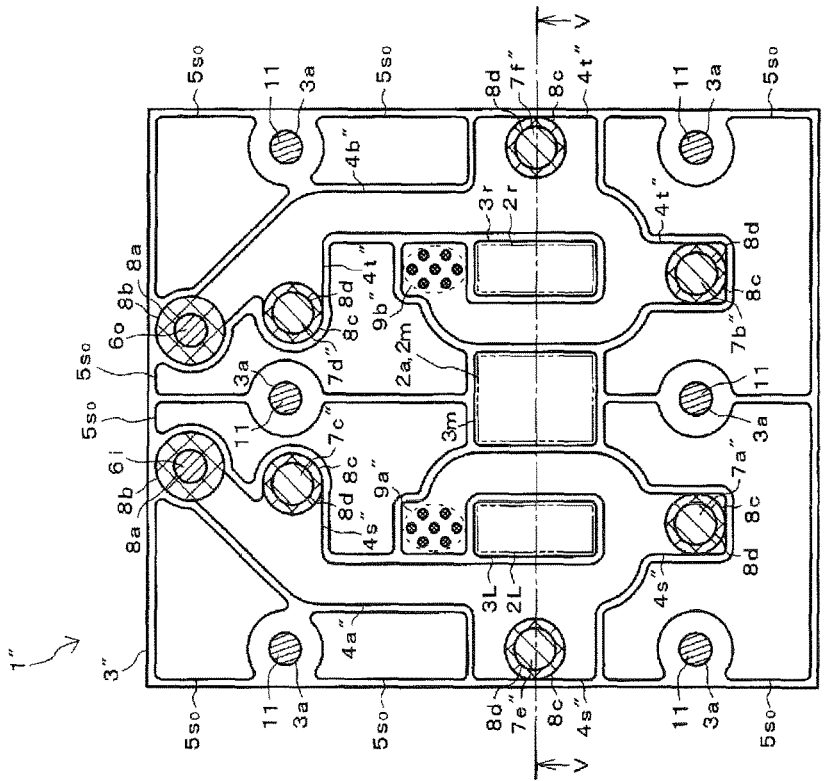

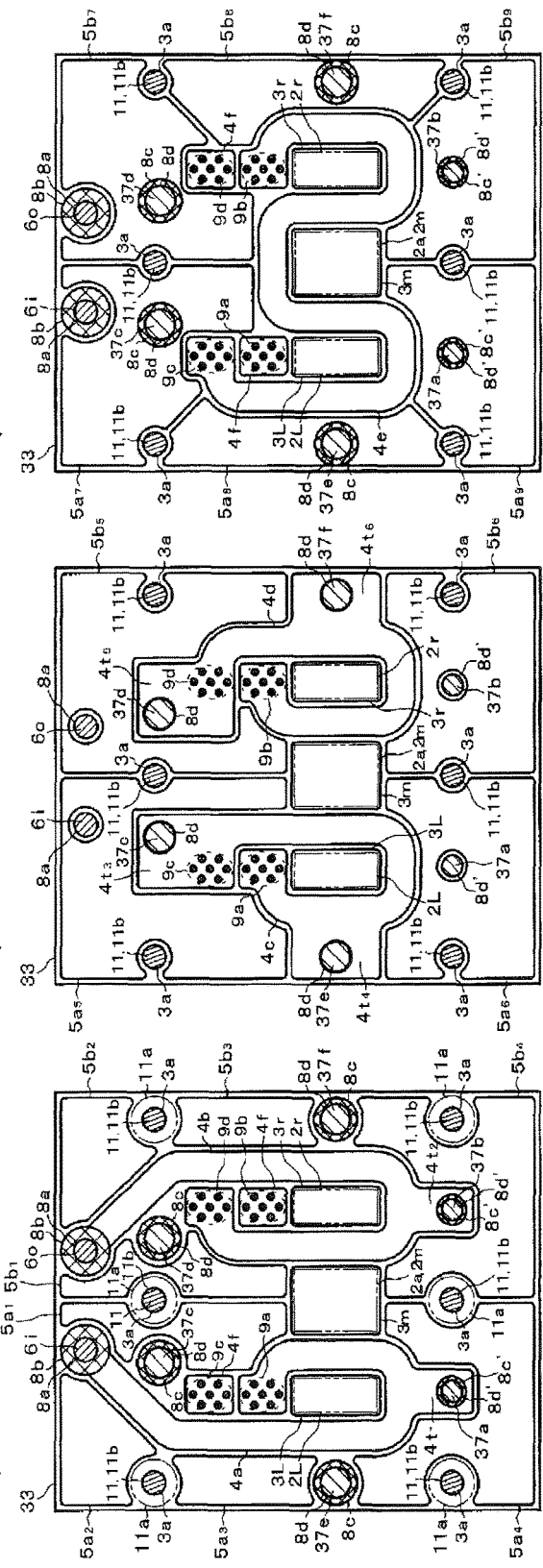

PRINTED CIRCUIT BOARD WITH INTEGRATED COIL, AND MAGNETIC DEVICE

TECHNICAL FIELD

The present invention relates to a printed circuit board with integrated coil, in which coil patterns are formed on a plurality of layers, and a magnetic device such as a choke coil and a transformer, which includes the printed circuit board with integrated coil.

BACKGROUND ART

For example, there is a switching power supply apparatus such as a DC-DC converter, which performs switching so as to convert a DC high voltage into an AC voltage, and then converts the AC voltage into a DC low voltage. A magnetic device such as a choke coil and a transformer is used in the switching power supply apparatus.

For example, Patent Documents 1 to 6 disclose a board in which a coil pattern constitutes a winding wire of a coil, and a magnetic device which includes the board.

In Patent Documents 1 to 5, a core formed of a magnetic substance passes through the board. The board is formed of an insulating substance and has a plurality of layers. The coil pattern is formed on each of the layers so as to be wound around the core. Coil patterns on the different layers are connected to each other by using a through hole and the like. The coil pattern or the through hole is formed of a conductor of copper and the like.

In Patent Document 6, the board is formed of a pair of insulating layers and a magnetic layer interposed between the pair of insulating layers. A coil pattern formed of a conductor is formed on the magnetic layer. The coil pattern is obtained by performing winding multiple times in a plate face direction or a thickness direction of the board.

If a current flows in the coil pattern, heat is generated from the coil pattern and thus the temperature of the board becomes greater. As heat-dissipating measures for the board, the coil pattern is formed on almost of the entire area of each of the layers in the board in Patent Document 1. A heat radiator is attached to an end portion of the board.

In Patent Document 3, a portion of the coil pattern on each of layers in the board is widened and a heat-dissipation pattern portion is provided. A downward board protrudes from an upward board and the heat-dissipation pattern portion is provided on a protrusion portion so as to cause the heat-dissipation pattern portion to directly come into contact with an outside air. A position of the heat-dissipation pattern portion (provided in each of the layers) in a face direction is different.

In Patent Document 6, a heat-transfer through conductor which passes through the magnetic layer and a downward insulating layer is provided on an inside of the coil pattern. A heat-dissipation conductor layer connected to the heat-transfer through conductor is provided on a lower surface of the board. The heat-transfer through conductor and the heat-dissipation conductor layer are not connected to the coil pattern.

PRIOR ART DOCUMENT(S)

Patent Document(s)

Patent Document 1: JP-A-2008-205350
Patent Document 2: JP-A-H07-038262
Patent Document 3: JP-A-H07-086755
Patent Document 4: WO-A1-2010/026690
Patent Document 5: JP-A-H08-069935
Patent Document 6: JP-A-2008-177516

SUMMARY OF THE INVENTION

Problem to be Solved by the Invention

For example, a high current flows in a coil pattern and thus many quantities of heat are generated from the coil pattern in a board which is used for a magnetic device used in a DC-DC converter in which a high current flows, and with which a coil is integrated. Heat generated in the coil pattern is accumulated and then becomes more as the number of layers of the board becomes more, on which coil patterns are provided becomes greater. Thus, the temperature of the board easily increases. If the temperature of the board rises, characteristics of the magnetic device may fluctuate or performance may be deteriorated. When other electronic components such as an IC chip are mounted on the same board, the electronic component may be incorrectly operated or may be damaged.

As the coil pattern becomes wider in the plate face direction of the board as in Patent Document 1 or Patent Document 3, heat generated in the coil pattern is emitted more and thus it is possible to easily dissipate heat. However, since the size of the board or the magnetic device becomes larger due to the widened coil pattern, this is opposed to a request of a small size.

An object of the present invention is to provide a printed circuit board with integrated coil and a magnetic device, which can easily dissipate heat generated from a coil pattern without a large size.

Means for Solving the Invention

According to the present invention, there is provided a printed circuit board with integrated coil in which coil patterns formed of a conductor are provided in a plurality of layers. The coil pattern is provided on at least one outer surface layer. A heat-dissipation pattern formed of a conductor is provided on at least the one outer surface layer so as to correspond to the coil pattern provided in another layer. The coil pattern in one outer surface layer and the heat-dissipation pattern in the one outer surface layer are separated from each other. Thermal inter-layer connection means formed of a conductor for connecting the coil pattern provided in the another layer and the heat-dissipation pattern provided in the one outer surface layer which correspond to each other is provided.

According to the present invention, there is provided a magnetic device which includes the printed circuit board with integrated coil and a core. The core is formed of a magnetic substance and passes through the printed circuit board with integrated coil. Coil patterns are formed in a plurality of layers of the printed circuit board with integrated coil so as to be wound around the core.

With the configuration, heat generated in the coil pattern in another layer of the printed circuit board with integrated coil is transferred to the heat-dissipation pattern in the outer surface layer by the thermal inter-layer connection means. Thus, it is possible to easily dissipate the heat. As a result, heat generation by the coil pattern is allowed, and thus the coil pattern may not be widened in a plate face direction of the printed circuit board with integrated coil, and it is possible to avoid increasing of the sizes of the printed circuit board with integrated coil and the magnetic device.

According to the present invention, the printed circuit board with integrated coil may further include electrical inter-layer connection means formed of a conductor for connecting the coil patterns in different layers to each other.

According to the present invention, in the printed circuit board with integrated coil, a front-side outer surface layer, a back-side outer surface layer, and at least one inner layer provided between the front-side outer surface layer and the back-side outer surface layer may be provided. The coil pattern may be provided in each of the layers. A plurality of heat-dissipation patterns may be provided in the back-side outer surface layer so as to correspond to the coil patterns provided in other layers, respectively. The heat-dissipation patterns may be separated from each other, and the heat-dissipation patterns and the coil pattern provided in the back-side outer surface layer may be separated from each other. As the thermal inter-layer connection means, first thermal inter-layer connection means and second thermal inter-layer connection means may be provided. The first thermal inter-layer connection means may connect the coil pattern in the front-side outer surface layer and the heat-dissipation pattern corresponding to the coil pattern. The second thermal inter-layer connection means may connect the coil pattern in the inner layer and the heat-dissipation pattern corresponding to the coil pattern.

According to the present invention, in the printed circuit board with integrated coil, a plurality of first thermal inter-layer connection means and a plurality of second thermal inter-layer connection means may be provided. A total volume of the plurality of second thermal inter-layer connection means may be larger than a total volume of the plurality of first thermal inter-layer connection means.

According to the present invention, in the printed circuit board with integrated coil, a number of the second thermal inter-layer connection means is greater than a number of the first thermal inter-layer connection means.

According to the present invention, in the printed circuit board with integrated coil, the first thermal inter-layer connection means and the second thermal inter-layer connection means may be formed of a columnar body. A diameter of the second thermal inter-layer connection means may be greater than a diameter of the first thermal inter-layer connection means.

According to the present invention, the printed circuit board with integrated coil may further include at least a front-side outer surface layer and a back-side outer surface layer. The coil patterns may be provided in the front-side outer surface layer and the back-side outer surface layer. The heat-dissipation patterns may be provided in the back-side outer surface layer so as to correspond to the coil pattern provided in the front-side outer surface layer. The heat-dissipation patterns may be separated from each other, and the heat-dissipation pattern and the coil pattern provided in the back-side outer surface layer may be separated from each other. A plurality of thermal inter-layer connection means for connecting the coil pattern provided in the front-side outer surface layer and the heat-dissipation pattern in the back-side outer surface layer which correspond to each other may be provided. In this case, a total area of the coil pattern in the front-side outer surface layer and the heat-dissipation patterns in the back-side outer surface layer corresponding to the coil pattern may be larger than an area of the coil pattern in the back-side outer surface layer.

According to the present invention, the printed circuit board with integrated coil may further include at least a front-side outer surface layer and a back-side outer surface layer. The coil patterns may be provided in the front-side outer surface layer and the back-side outer surface layer. A first heat-dissipation pattern formed of a conductor may be provided in the back-side outer surface layer so as to correspond to the coil pattern of the front-side outer surface layer. A second heat-dissipation pattern which is formed of a conductor and is connected to the coil pattern of the back-side outer surface layer may be provided in the back-side outer surface layer. The first heat-dissipation pattern, and the coil pattern and the second heat-dissipation pattern of the back-side outer surface layer may be separated from each other. A plurality of the thermal inter-layer connection means which connect the coil pattern provided in the front-side outer surface layer and the first heat-dissipation pattern which correspond to each other may be provided. An area of the first heat-dissipation pattern may be larger than an area of the second heat-dissipation pattern.

According to the present invention, in the magnetic device, a heat radiator may be provided on the outer surface layer side in the heat-dissipation pattern of the printed circuit board with integrated coil.

Advantage of the Invention

According to the present invention, it is possible to provide a printed circuit board with integrated coil and a magnetic device which can easily dissipate heat emitted from the coil pattern without a large size.

BRIEF DESCRIPTION OF THE DRAWINGS

FIGS. 4(*a*) and 4(*b*) are cross-sectional views of the magnetic device in FIG. 2.

FIGS. 5(*a*) and 5(*b*) are plan views of layers of a printed circuit board with integrated coil of a magnetic device according to a second embodiment of the present invention.

FIGS. 7(*a*) and 7(*b*) are plan views of layers of a printed circuit board with integrated coil of a magnetic device according to a third embodiment of the present invention.

FIGS. 9(*a*) to 9(*c*) are plan views of layers of a printed circuit board with integrated coil according to a fourth embodiment of the present invention.

MODE FOR CARRYING OUT THE INVENTION

Hereinafter, embodiments according to the present invention will be described with reference to the drawings. In each of the drawings, the same parts or the corresponding parts are denoted by the same reference signs.

Figure 1:
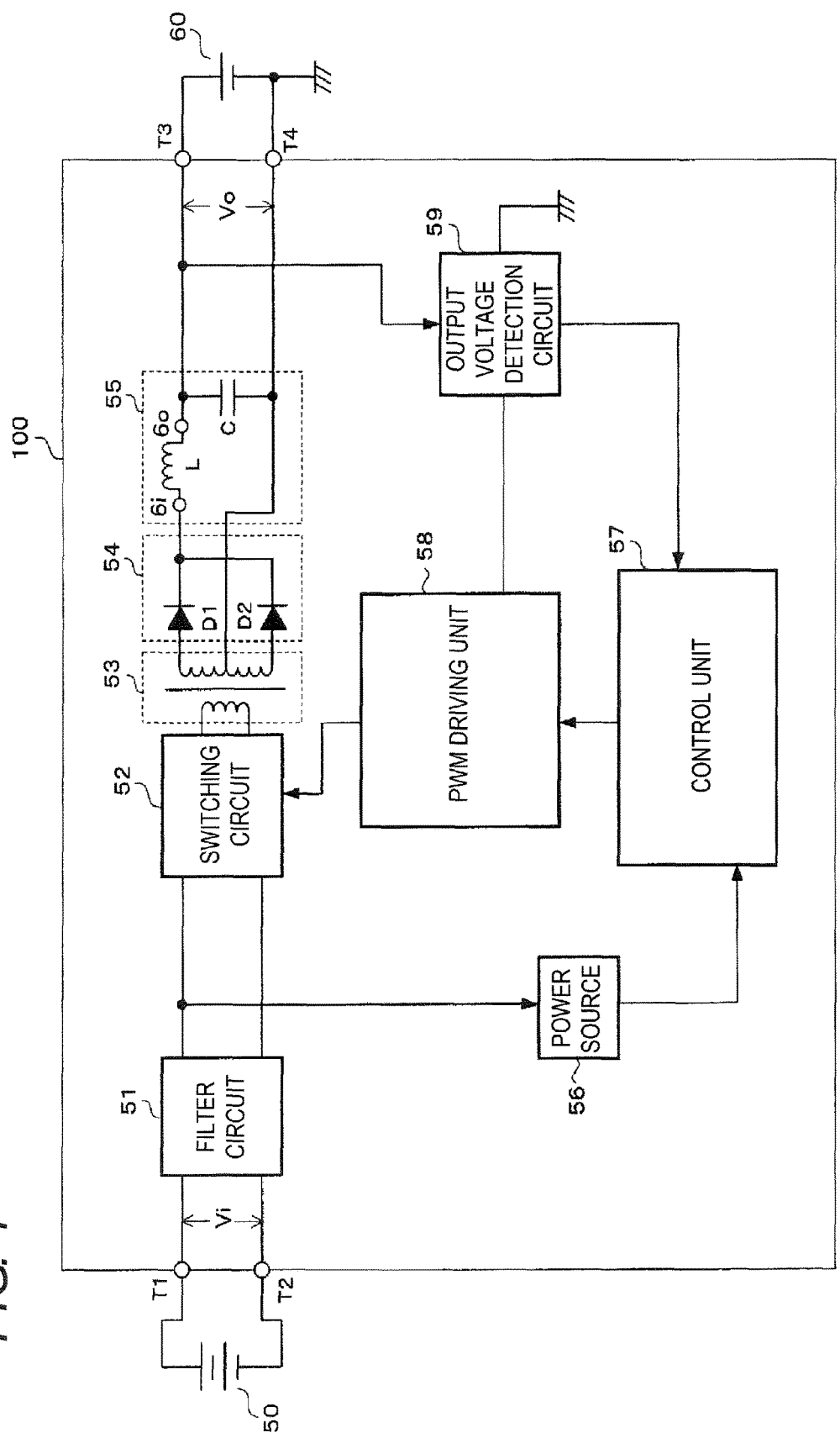
FIG. 1 is a configuration diagram of a switching power supply apparatus.

FIG. 1 is a configuration diagram of a switching power supply apparatus 100. The switching power supply apparatus 100 is a DC-DC converter for an electric vehicle (or hybrid car). The switching power supply apparatus 100 performs switching so as to convert a DC high voltage into an AC voltage, and then converts the AC voltage into a DC low voltage. Details thereof will be described below.

A high voltage battery 50 is connected to input terminals T1 and T2 of the switching power supply apparatus 100. A voltage of the high voltage battery 50 is, for example, in a range of DC 220 V to DC 400 V. A noise is removed from a DC voltage Vi of the high voltage battery 50 input to the input terminals T1 and T2 by a filter circuit 51, and then a result of removal is applied to a switching circuit 52.

The switching circuit 52 is formed of a well-known circuit having, for example, a field effect transistor (FET). In the switching circuit 52, the FET is caused to turn ON and OFF based on a pulse width modulation (PWM) signal from a PWM driving unit 58 and a switching operation is performed on the DC voltage. Thus, the DC voltage is converted into a high-frequency pulse voltage.

The converted pulse voltage is applied to a rectifier circuit 54 through a transformer 53. The rectifier circuit 54 rectifies the pulse voltage by using a pair of diodes D1 and D2. A voltage rectified by the rectifier circuit 54 is input to a smoothing circuit 55. The smoothing circuit 55 smooths the rectified voltage by a filter action which is performed by a choke coil L and a capacitor C. The smoothed voltage is output to output terminals T3 and T4 as a low DC voltage. A low voltage battery 60 connected to the output terminals T3 and T4 is charged so as to be, for example, DC 12 V by using this DC voltage. A DC voltage of the low voltage battery 60 is supplied to various types of vehicle-mounted electric components (not illustrated).

An output voltage Vo of the smoothing circuit 55 is detected by an output voltage detection circuit 59 and then is output to the PWM driving unit 58. The PWM driving unit 58 calculates a duty ratio of a PWM signal based on the output voltage Vo, and generates the PWM signal in accordance with the duty ratio. The PWM driving unit 58 outputs the generated PWM signal to a gate of the FET in the switching circuit 52. Thus, feedback control for holding the output voltage to be constant is performed.

A control unit 57 controls an operation of the PWM driving unit 58. A power source 56 is connected to an output side of the filter circuit 51. The power source 56 steps down a voltage of the high voltage battery 50 and supplies a power source voltage (for example, DC 12 V) to the control unit 57.

In the switching power supply apparatus 100, magnetic devices 1, 1', and 1" which will be described later are used as the choke coil L in the smoothing circuit 55. A high current of, for example, DC 150 A flows in the choke coil L. Terminals 6i and 6o for power input and output are provided at both ends of the choke coil L.

Next, structures of a magnetic device 1 and a printed circuit board 3 with integrated coil (simply referred to as "board 3" below) included in the magnetic device 1 according to the first embodiment will be described with reference to FIGS. 2 to 4.

Figure 2:
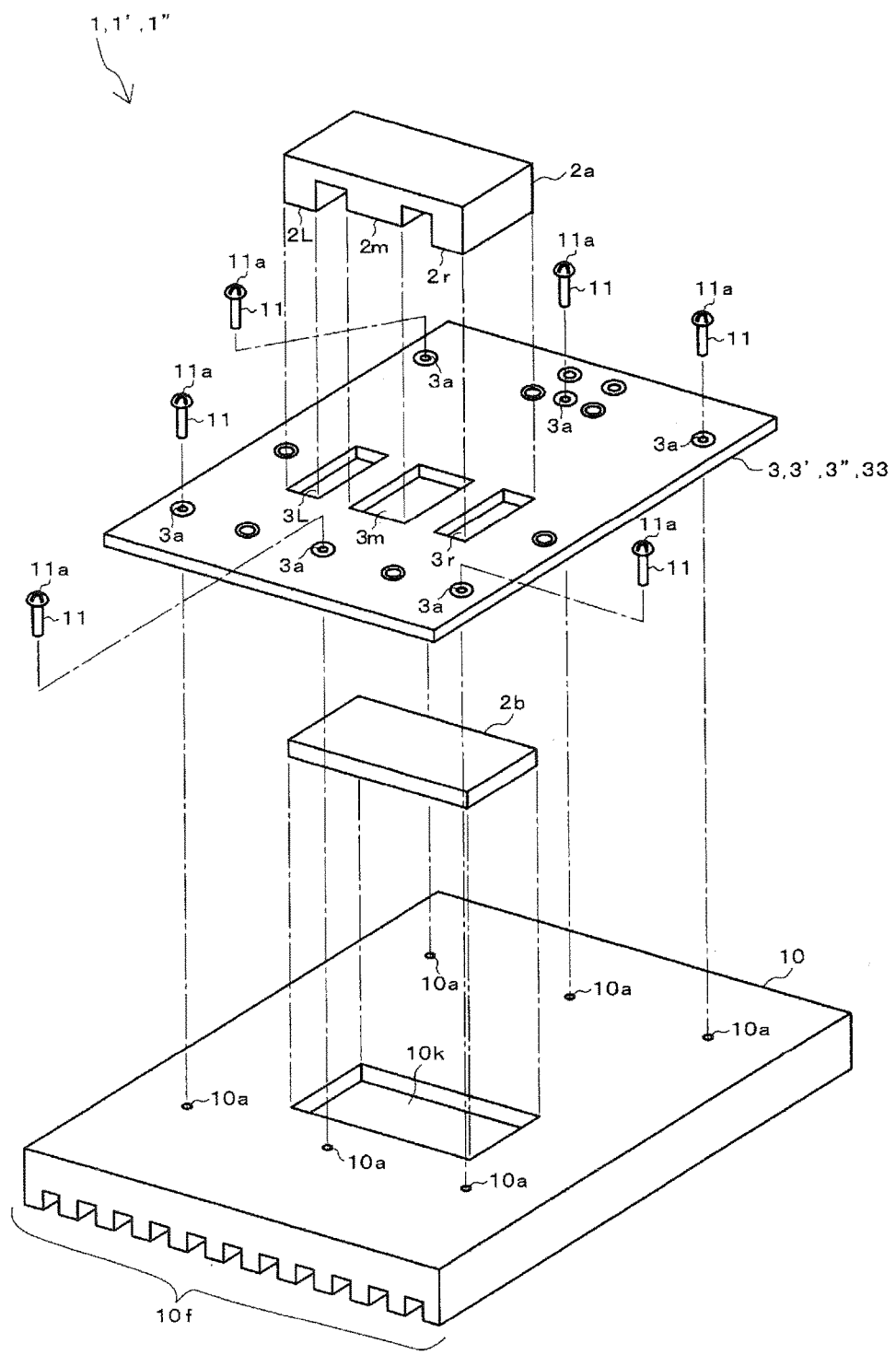
FIG. 2 is an exploded perspective view of a magnetic device according to a first embodiment of the present invention.
Figure 3A:
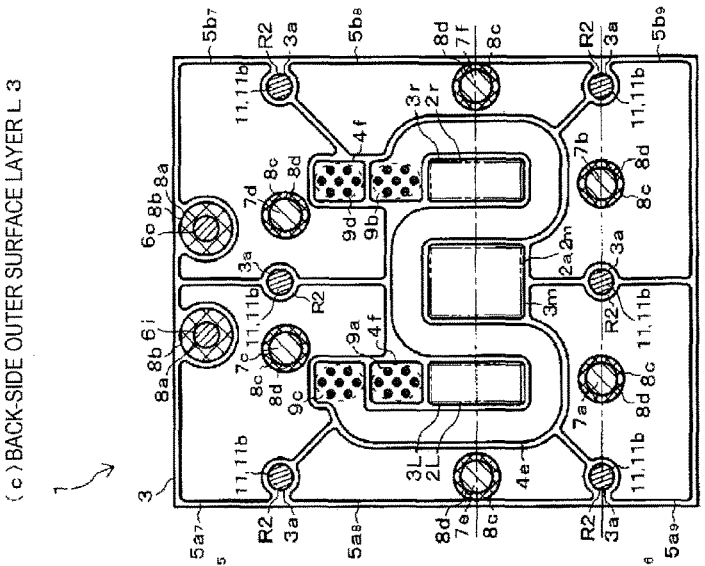
FIGS. 3(*a*) to 3(*c*) are plan views of layers of the printed circuit board with integrated coil in FIG. 2.
Figure 3B:
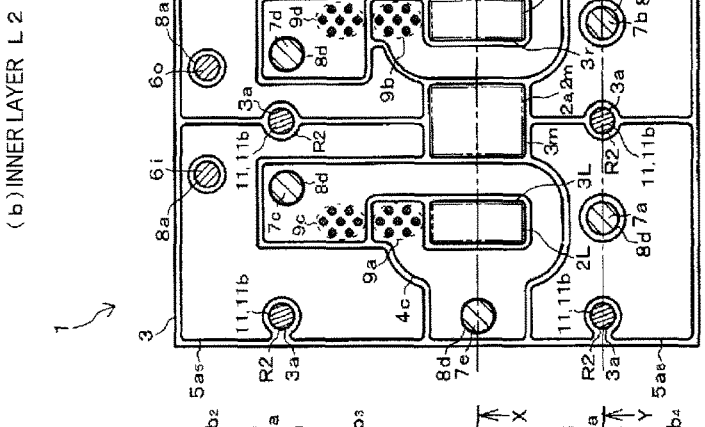
Figure 3C:
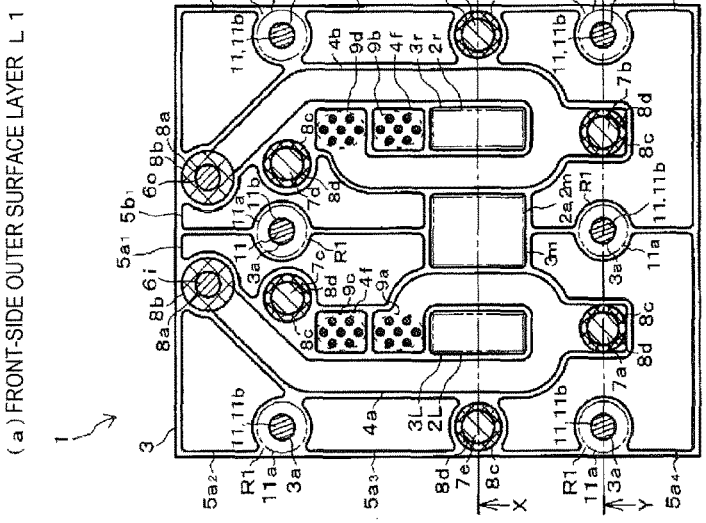

FIG. 2 is an exploded perspective view of the magnetic device 1 (also similar in the magnetic devices 1' and 1" which will be described later). FIGS. 3(a) to 3(c) are plan views of layers in the board 3. FIG. 4 is a cross-sectional view of the magnetic device 1; FIG. 4(a) illustrates an X-X cross-section in FIGS. 3(a) to 3(c), and FIG. 4(b) illustrates a Y-Y cross-section in FIGS. 3(a) to 3(c).

As illustrated in FIG. 2 and FIGS. 4(a) and 4(b), cores 2a and 2b are configured by a pair of two, that is, an upper core 2a and a lower core 2b. The upper core 2a has an E-shape in a cross-section and the lower core 2b has an I-shape in the cross-section. The cores 2a and 2b are formed of a magnetic substance such as ferrite and an amorphous metal.

The upper core 2a has three convex portions 2m, 2L, and 2r so as to protrude downwardly. As illustrated in FIGS. 4(a) and 4(b), a protrusion amount of the right and left convex portions 2L and 2r is more than a protrusion amount of the center convex portion 2m.

As illustrated in FIG. 4(a), lower ends of the right and left convex portions 2L and 2r of the upper core 2a adhere to an upper surface of the lower core 2b and thus the cores 2a and 2b are combined. Since DC superimposition characteristics are strengthened in this state, a gap of a predetermined size is provided between the convex portion 2m of the upper core 2a and the upper surface of the lower core 2b. Thus, even when a high current flows in the magnetic device 1 (choke coil L), it is possible to realize a predetermined inductance (also similar in the magnetic devices 1' and 1" which will be described later). The cores 2a and 2b are fixed to each other by fixation means (not illustrated) such as a screw and metal fittings.

The lower core 2b is fitted into a concave portion 10k (FIG. 2) provided on an upside of the heat sink 10. A fin 10f is provided on a downside of the heat sink 10. The heat sink 10 is made of metal and is an example of a "heat radiator" according to the present invention.

The board 3 is configured from a thick copper foil board obtained by forming a pattern on each layer of a thin plate-like base with a thick copper foil (conductor). The thin plate-like base is formed of an insulating substance. In this embodiment, other electronic components or other circuits are not provided on the board 3. However, when the magnetic device 1 is practically used in the switching power supply apparatus 100 in FIG. 1, other electronic components or other circuits are provided on the same board larger than the board 3, in addition to the magnetic device 1 and the switching power supply apparatus 100 (also similar in the magnetic devices 1' and 1" which will be described later).

A front-side outer surface layer L1 as illustrated in FIG. 3(a) is provided on a front surface (upper surface in FIGS. 2 and 4(a) and 4(b)) of the board 3. A back-side outer surface layer L3 as illustrated in FIG. 3(c) is provided on a back surface (lower surface in FIGS. 2 and 4(a) and 4(b)) of the board 3. As illustrated in FIGS. 4(a) and 4(b), an inner layer L2 as illustrated in FIG. 3(b) is provided between both of the outer surface layers L1 and L3. That is, the board 3 has three layers L1, L2, and L3 of the two outer surface layers L1 and L3, and the one inner layer L2.

A plurality of through holes 3m, 3L, 3r, and 3a are provided in the board 3. As illustrated in FIGS. 2 to 4(a), the convex portions 2m, 2L, and 2r of the core 2a are respectively inserted into the through holes 3m, 3L, and 3r having a large diameter among the through holes. That is, the convex portions 2m, 2L, and 2r of the core 2a pass through each of the layers L1 to L3 of the board 3.

As illustrated in FIGS. 2 and 4(b), screws 11 are respectively inserted into a plurality of through holes 3a having a small diameter. A back surface (back-side outer surface layer L3) of the board 3 is caused to face an upper surface (surface opposite to the fin 10f) of the heat sink 10. The screws 11 are respectively caused to pass through the through holes 3a from a front surface (front-side outer surface layer L1) of the board 3 and are screwed with screw holes 10a of the heat sink 10. Thus, as illustrated in FIGS. 4(a) and 4(b), the heat sink 10 is fixed to the back-side outer surface layer L3 side of the board 3 in a proximity state.

An insulating sheet 12 having a heat transfer property is interposed between the board 3 and the heat sink 10. Since the insulating sheet 12 has flexibility, the insulating sheet 12 adheres to the board 3 or the heat sink 10 without a gap.

As illustrated in FIGS. 3(a) to 3(c), conductors of through holes 8a and 8d, through hole groups 9a to 9d, pads 8b and 8c, the terminals 6i and 6o, patterns 4a to 4f, $5a_1$ to $5a_9$, and $5b_1$ to $5b_9$, and pins 7a to 7f are provided in the board 3. The through holes 8a and 8d, and the through hole groups 9a to 9d connect patterns 4a to 4f, $5a_7$ to $5a_9$, and $5b_7$ to $5b_9$ in different layers L1, L2, and L3 with each other.

In detail, the through hole 8a passes through the board 3 so as to connect the patterns 4a and 4b in the front-side outer surface layer L1 with other layers L2 and L3. As illustrated in FIGS. 4(a) and 4(b), the through hole 8d passes through the board 3 so as to connect the front-side outer surface layer L1 with other layers L2 and L3, to connect the patterns 4a and 4b in the front-side outer surface layer L1 with the patterns $5a_9$ and $5b_9$ in the back-side outer surface layer L3, or to connect the patterns 4c and 4d in the inner layer L2 with the patterns $5a_7$, $5a_8$, $5b_7$, and $5b_8$ in the back-side outer surface layer L3.

Each of the through hole groups 9a, 9b, 9c, and 9d has a diameter smaller than that of the through holes 8a and 8d. A plurality of through holes passing through the board 3 are configured by gathering the through holes at a predetermined interval. The through hole groups 9a and 9d connect the patterns 4a and 4b in the front-side outer surface layer L1 and the patterns 4c and 4d in the inner layer L2. The through hole groups 9b and 9c connect the patterns 4c and 4d in the inner layer L2 with the pattern 4e in the back-side outer surface layer L3.

The terminal 6i for inputting power is buried in one of a pair of through holes 8a having a large diameter, and the terminal 6o for outputting power is buried in another of the pair of through holes 8a. The terminals 6i and 6o are formed of a copper pin. Pads 8b formed of a copper foil are provided around the terminals 6i and 6o in the front-side outer surface layer L1 and the back-side outer surface layer L3. Copper plating is performed on front surfaces of the terminals 6i and 6o or the pads 8b. Lower ends of the terminals 6i and 6o come into contact with the insulating sheet 12 (not illustrated).

Coil patterns 4a to 4e and heat-dissipation patterns $5a_1$ to $5a_9$ and $5b_1$ to $5b_9$ are provided in the layers L1, L2, and L3 of the board 3. The patterns 4a to 4e, $5a_1$ to $5a_9$, and $5b_1$ to $5b_9$ are formed of copper foils. Insulating processing is performed on front surfaces of the patterns 4a, 4b, $5a_1$ to $5a_4$, and $5b_1$ to $5b_4$ in the front-side outer surface layer L1. The width, the thickness, or the cross-sectional area of the coil patterns 4a to 4e is set to achieve predetermined performance of a coil and to suppress heat quantities in the coil patterns 4a to 4e up to a certain extent and enable heat dissipation from the front surfaces of the coil patterns 4a to 4e even when a predetermined high current (for example, DC 150 A) flows.

As illustrated in FIG. 3(a), the coil pattern 4a is wound once in four directions of surroundings of the convex portion 2L in the front-side outer surface layer L1. The coil pattern 4b is wound once in four directions of surroundings of the convex portion 2r.

As illustrated in FIG. 3(b), the coil pattern 4c is wound once in the four directions of the surroundings of the convex portion 2L in the inner layer L2. The coil pattern 4d is wound once in the four directions of the surroundings of the convex portion 2r.

As illustrated in FIG. 3(c), the coil pattern 4e in the back-side outer surface layer L3 is wound once in the four directions of the surroundings of the convex portion 2L, is wound once in the three directions of the surroundings of the convex portion 2m, and then is wound once in the four directions of the surroundings of the convex portion 2r.

One end of the coil pattern 4a and one end of the coil pattern 4c are connected to each other by using the through hole group 9a. Another end of the coil pattern 4c and one end of the coil pattern 4e are connected to each other by using the through hole group 9c. Another end of the coil pattern 4e and one end of the coil pattern 4d are connected to each other by using the through hole group 9b. Another end of the coil pattern 4d and one end of the coil pattern 4b are connected to each other by using the through hole group 9d.

Copper plating may be performed on the front surface of each of through holes which have a small diameter and constitutes the through hole groups 9a to 9d. Copper and the like may be buried in the through hole. The through hole groups 9a to 9d are an example of "electrical inter-layer connection means" according to the present invention.

Small patterns 4f are provided in the surrounding of the through hole groups 9b and 9c in the front-side outer surface layer L1 and the surrounding of the through hole groups 9a and 9d in the back-side outer surface layer L3 in order to easily form the through holes. The through hole group 9a to 9d and the small patterns 4f are respectively connected to each other. The small patterns 4f are formed of a copper foil. Insulating processing is performed on front surfaces of the small patterns 4f in the front-side outer surface layer L1.

Another end of the coil pattern 4a is connected to the terminal 6i through the pad 8b. Another end of the coil pattern 4b is connected to the terminal 6o through the pad 8b.

With the above descriptions, after the coil patterns 4a to 4e of the board 3 are wound firstly around the convex portion 2L from the terminal 6i which is a starting point, the coil patterns 4a to 4e of the board 3 are connected to the inner layer L2 through the through hole group 9a, in the front-side outer surface layer L1. Then, after the coil patterns 4a to 4e are wound secondly around the convex portion 2L in the inner layer L2, the coil patterns 4a to 4e of the board 3 are connected to the back-side outer surface layer L3 through the through hole group 9c.

Then, after the coil patterns 4a to 4e are wound thirdly around the convex portion 2L and wound fourthly around the convex portion 2r through a circumference of the convex portion 2m, the coil patterns 4a to 4e are connected to the inner layer L2 through the through hole group 9b, in the back-side outer surface layer L3. Then, after the coil patterns 4a to 4e are wound fifthly around the convex portion 2r in the inner layer L2, the coil patterns 4a to 4e are connected to the front-side outer surface layer L1 through the through hole group 9d. After the coil patterns 4a to 4e are wound sixthly around the convex portion 2r in the front-side outer surface layer L1, the coil patterns 4a to 4e are connected to the terminal 6o which is an ending point.

As described above, a current flowing in the magnetic device 1 flows in an order of the terminal 6i, the coil pattern 4a, the through hole group 9a, the coil pattern 4c, the through hole group 9c, the coil pattern 4e, the through hole group 9b, the coil pattern 4d, the through hole group 9d, the coil pattern 4b, and the terminal 6o.

The heat-dissipation patterns $5a_1$ to $5a_9$ and $5b_1$ to $5b_9$ are formed in certain free spaces around the coil patterns 4a to 4e or the small patterns 4f in the layers L1 to L3, so as to be separate from the patterns 4a to 4e and 4f. The heat-dissipation patterns $5a_1$ to $5a_9$ and $5b_1$ to $5b_9$ are separated from each other. That is, each of the heat-dissipation patterns $5a_1$ to $5a_9$ and $5b_1$ to $5b_9$ is separated from the coil patterns 4a to 4e, the small pattern 4f, and other heat-dissipation patterns $5a_1$ to $5a_9$ and $5b_1$ to $5b_9$.

The pads 8b, the terminals 6i and 6o, the through hole 3a, and the screws 11 are insulated from the heat-dissipation patterns $5a_1$ to $5a_9$ and $5b_1$ to $5b_9$. An insulating area R1 around the through hole 3a in the front-side outer surface layer L1 is wider than an insulating area R2 (area of no conductor) around the through hole 3a in the inner layer L2 or the back-side outer surface layer L3, in order to cause a head portion 11a of the screw 11 having a diameter larger than that of a shaft portion 11b thereof to be disposed on the front surface side of the board 3 (see FIGS. 3(a) to 3(c))

Heat-dissipation pins 7a to 7f are respectively buried into a plurality of through holes 8d having a large diameter. The heat-dissipation pins 7a to 7f are formed of metallic pins which are formed to have a columnar shape by using a conductor of copper or the like. The pads 8c formed of a copper foil are provided around the heat-dissipation pins 7a to 7f in the front-side outer surface layer L1 and the back-side outer surface layer L3. Copper plating is performed on front surfaces of the heat-dissipation pins 7a to 7f or the pads 8c. Lower ends of the heat-dissipation pins 7a to 7f come into contact with the insulating sheet 12 (see FIG. 4(b)). The heat-dissipation pins 7a to 7e, the pads 8c around the heat-dissipation pins 7a to 7e, and the through hole 8d are an example of "thermal inter-layer connection means" according to the present invention.

As illustrated in FIG. 3(a), the heat-dissipation pin 7a, the pad 8c around the heat-dissipation pin 7a, and the through hole 8d are connected to the coil pattern 4a in the front-side outer surface layer L1. The heat-dissipation pin 7b, the pad 8c around the heat-dissipation pin 7b, and the through hole 8d are connected to the coil pattern 4b. Other heat-dissipation pins 7c to 7f, the pads 8c around the heat-dissipation pins 7c to 7f, and the through holes 8d are insulated from the heat-dissipation patterns $5a_1$ to $5a_4$ and $5b_1$ to $5b_4$, the coil patterns 4a and 4b, and the small patterns 4f. The coil patterns 4a and 4b and the small pattern 4f are insulated from the heat-dissipation patterns $5a_1$ to $5a_4$ and $5b_1$ to $54b_4$.

As illustrated in FIG. 3(b), the heat-dissipation pins 7c and 7e, and the through holes 8d around the heat-dissipation pins 7c and 7e are connected to the coil pattern 4c in the inner layer L2. The heat-dissipation pins 7d and 7f, and the through holes 8d around the heat-dissipation pins 7d and 7f are connected to the coil pattern 4d. Other heat-dissipation pins 7a and 7b, and the through holes 8d around the heat-dissipation pins 7a and 7b are insulated from the heat-dissipation patterns $5a_5$, $5a_6$, $5b_5$, and $5b_6$, and the coil patterns 4c and 4d. The coil patterns 4c and 4d are insulated from the heat-dissipation patterns $5a_5$, $5a_6$, $5b_5$, and $5b_6$.

As illustrated in FIG. 3(c), a heat-dissipation pattern $5a_9$ is provided in the back-side outer surface layer L3 so as to correspond to the coil pattern 4a in the front-side outer surface layer L1. A heat-dissipation pattern $5b_9$ is provided in the back-side outer surface layer L3 so as to correspond to the coil pattern 4b. Heat-dissipation patterns $5a_7$ and $5a_8$ are provided so as to correspond to the coil pattern 4c in the inner layer L2. Heat-dissipation patterns $5b_7$ and $5b_8$ are provided so as to correspond to the coil pattern 4d.

The heat-dissipation pin 7c, the pad 8c around the heat-dissipation pin 7c, and the through hole 8d are connected to the heat-dissipation pattern $5a_7$ in the back-side outer surface layer L3. The heat-dissipation pin 7e, the pad 8c around the heat-dissipation pin 7e, and the through hole 8d are connected to the heat-dissipation pattern $5a_8$. The heat-dissipation pin 7a, the pad 8c around the heat-dissipation pin 7a, and the through hole 8d are connected to the heat-dissipation pattern $5a_9$.

The heat-dissipation pin 7d, the pad 8c around the heat-dissipation pin 7d, and the through hole 8d are connected to the heat-dissipation pattern $5b_7$ in the back-side outer surface layer L3. The heat-dissipation pin 7f, the pad 8c around the heat-dissipation pin 7f, and the through hole 8d are connected to the heat-dissipation pattern $5b_8$. The heat-dissipation pin 7b, the pad 8c around the heat-dissipation pin 7b, and the through hole 8d are connected to the heat-dissipation pattern $5b_9$.

The coil pattern 4e and the small pattern 4f are insulated from the heat-dissipation patterns $5a_7$ to $5a_9$ and $5b_7$ to $5b_9$ in the back-side outer surface layer L3. The coil pattern 4e and the small pattern 4f are insulated from the heat-dissipation pins 7a to 7f, the pads 8c, and the through holes 8d.

With the above descriptions, the coil pattern 4a in the front-side outer surface layer L1 and the heat-dissipation pattern $5a_9$ in the back-side outer surface layer L3 are connected to each other by using the heat-dissipation pin 7a, the pad 8c around the heat-dissipation pin 7a, and the through hole 8d. The coil pattern 4b in the front-side outer surface layer L1 and the heat-dissipation pattern $5b_9$ in the back=side outer surface layer L3 are connected to each other by using the heat-dissipation pin 7b, the pad 8c around the heat-dissipation pin 7b, and the through hole 8d. That is, the coil patterns 4a and 4b in the front-side outer surface layer L1 are respectively connected to the corresponding heat-dissipation patterns $5a_9$ and $5b_9$ at one place in the back-side outer surface layer L3. The heat-dissipation pins 7a and 7b, the pads 8c around the heat-dissipation pins 7a and 7b, and the through holes 8d are an example of "first thermal inter-layer connection means" according to the present invention.

The coil pattern 4c in the inner layer L2 and the heat-dissipation patterns $5a_7$ and $5a_8$ in the back-side outer surface layer L3 are connected to each other by using the heat-dissipation pins 7c and 7e, the pads 8c around the heat-dissipation pins 7c and 7e, and the through holes 8d. The coil pattern 4d in the inner layer L2 and the heat-dissipation patterns $5b_7$ and $5b_8$ in the back-side outer surface layer L3 are connected to each other by using the heat-dissipation pins 7d and 7f, the pads 8c around the heat-dissipation pins 7d and 7f, and the through holes 8d. That is, the coil patterns 4c and 4d in the inner layer L2 are respectively connected to the corresponding heat-dissipation patterns $5a_7$, $5a_8$, $5b_7$, and $5b_8$ at two places in the back-side outer surface layer L3. The heat-dissipation pins 7c to 7f, the pads 8c around the heat-dissipation pins 7c to 7f, and the through holes 8d are an example of "second thermal inter-layer connection means" according to the present invention.

The volume of each of the heat-dissipation pins 7a to 7f, the volume of each of the pads 8c, and the volume of each of the through holes 8d are the same. For this reason, the total volume of a plurality of second thermal inter-layer connection means (at four places) is larger than the total volume of a plurality of first thermal inter-layer connection means (at two places). The plurality of second thermal inter-layer connection means connects the coil patterns 4c and 4d in the inner layer L2 and the heat-dissipation patterns $5a_7$, $5a_8$, $5b_7$, and $5b_8$ in the back-side outer surface layer L3. The plurality of first thermal inter-layer connection means connects the coil patterns 4a and 4b in the front-side outer surface layer L1, and the heat-dissipation patterns $5a_9$ and $5b_9$ in the back-side outer surface layer L3. The former first thermal inter-layer connection means corresponds to the heat-dissipation pins 7a and 7b, the pads 8c around the heat-dissipation pins 7a and 7b, and the through hole 8d. The latter second thermal inter-layer connection means corresponds to the heat-dissipation pins 7c to 7e, the pads 8c around the heat-dissipation pins 7c to 7e, and the through hole 8d.

Since a high current flows in the coil patterns 4a to 4e, the coil patterns 4a to 4e function as a heat generation source, and thus the temperature of the board 3 increases.

In the front-side outer surface layer L1, heat of the board 3 is diffused to the heat-dissipation patterns $5a_1$ to $5a_4$ and $5b_1$ to $5b_4$, and is dissipated on the front surfaces of the conductors such as the patterns 4a, 4b, 4f, $5a_1$ to $5a_4$ and $5b_1$ to $5b_4$. Heat of the board 3 is transferred to the conductors passing through the board 3, such as the heat-dissipation pins 7a to 7f, the through holes 8d and 8a, and the through hole groups 9a to 9d, and thus is dissipated through the insulating sheet 12 by the heat sink 10. The through hole groups 9a to 9d function as thermal vias.

Particularly, heat generated by the coil patterns 4a and 4b in the front-side outer surface layer L1 is transferred to the heat-dissipation pins 7a and 7b and the like and is diffused to the heat-dissipation patterns $5a_9$ and $5b_9$ in the back-side outer surface layer L3. Thus, the heat is dissipated from front surfaces of the heat-dissipation patterns $5a_9$ and $5b_9$ or lower surfaces of the heat-dissipation pins 7a and 7b, through the insulating sheet 12 by the heat sink 10.

In the inner layer L2, heat of the board 3 is diffused to the heat-dissipation patterns $5a_5$, $5a_6$, $5b_5$, and $5b_6$, is transferred to the conductors passing through the board 3, such as the heat-dissipation pins 7a to 7f, the through holes 8d, and the through hole groups 9a to 9d, and thus the heat is dissipated through the insulating sheet 12 by the heat sink 10. Particularly, heat generated by the coil patterns 4c and 4d is transferred to the heat-dissipation pins 7c to 7f and the like and is diffused to the heat-dissipation patterns $5a_7$, $5a_8$, $5b_7$, and $5b_8$ in the back-side outer surface layer L3. Thus, the heat is dissipated from front surfaces of the heat-dissipation patterns $5a_7$, $5a_8$, $5b_7$, and $5b_8$ or lower surfaces of the heat-dissipation pins 7c to 7f, through the insulating sheet 12 by the heat sink 10.

In the back-side outer surface layer L3, heat of the board 3 is diffused to the heat-dissipation patterns $5a_7$ to $5a_9$ and $5b_7$ to $5b_9$, and is dissipated from front surfaces of the conductors such as the patterns 4e, 4f, $5a_7$ to $5a_9$, and $5b_7$ to $5b_9$, through the insulating sheet 12 by the heat sink 10. Particularly, heat generated by the coil pattern 4e is dissipated from the front surface of the coil pattern 4e through the insulating sheet 12 by the heat sink 10.

According to the first embodiment, heat generated by the coil patterns 4a to 4d in the front-side outer surface layer L1 and the inner layer L2 of the board 3 is transferred to the heat-dissipation patterns $5a_7$ to $5a_9$ and $5b_7$ to $5b_9$ in the back-side outer surface layer L3 by the thermal inter-layer connection means such as the heat-dissipation pins 7a to 7f. Thus, the heat is transferred to the heat sink 10 from the front surfaces of the heat-dissipation patterns $5a_7$ to $5a_9$ and $5b_7$ to $5b_9$, and is dissipated by the heat sink 10.

Heat generated by the coil patterns 4a and 4b in the front-side outer surface layer L1 is also dissipated from the front surfaces of the patterns 4a and 4b. In the back-side outer surface layer L3, heat generated by the coil pattern 4e is transferred to the heat sink 10 from the front surface of the pattern 4e and is dissipated by the heat sink 10.

Thus, it is possible to easily dissipate heat emitted from the coil patterns 4a to 4e outwardly. As a result, since heat generation by the coil patterns 4a to 4e is allowed, the coil patterns 4a to 4e may be largely widened in the plate face direction of the board 3, and it is possible to avoid increasing of the sizes of the board 3 and the magnetic device 1.

The coil patterns 4a to 4e in different layers L1 to L3 are connected to the coil patterns 4a to 4e in other different layers L1 to L3 by using the through hole groups 9a to 9d. The coil patterns 4a to 4d and the heat-dissipation patterns $5a_7$ to $5a_9$ and $5b_7$ to $5b_9$ are connected to each other by using the heat-dissipation pins 7a to 7f and the like. The coil pattern 4e is insulated from the heat-dissipation patterns $5a_7$ to $5a_9$ and $5b_7$ to $5b_9$. For this reason, it is possible to reliably distinguish between an electrification path and a heat-dissipation path for the coil patterns 4a to 4e.

Heat generated by the coil patterns 4a to 4d in the front-side outer surface layer L1 and the inner layer L2 of the board 3 is transferred to the heat sink 10 through a different heat-dissipation path of the heat-dissipation pins 7a to 7f, or the heat-dissipation patterns $5a_7$ to $5a_9$ and $5b_7$ to $5b_9$ in the back-side outer surface layer L3, and thus it is possible to dissipate the heat with high efficiency.

The number of second thermal inter-layer connection means is greater than the number of first thermal inter-layer connection means. The second thermal inter-layer connection means connects the coil patterns 4c and 4d in the inner layer L2 and the heat-dissipation patterns $5a_7$, $5a_8$, $5b_7$, and $5b_8$ in the back-side outer surface layer L3. The first thermal inter-layer connection means connects the coil patterns 4a and 4b in the front-side outer surface layer L1 and the heat-dissipation patterns $5a_9$ and $5b_9$ in the back-side outer surface layer L3. Thus, the volume of transferred heat to the heat-dissipation patterns $5a_7$, $5a_8$, $5b_7$, and $5b_8$ in the back-side outer surface layer L3 from the coil patterns 4c and 4d in the inner layer L2 is larger than the volume of transferred heat to the heat-dissipation patterns $5a_9$ and $5b_9$ in the back-side outer surface layer L3 from the coil patterns 4a and 4b in the front-side outer surface layer L1. For this reason, it is possible to transfer heat generated by the coil patterns 4c and 4d in the inner layer L2 which does not come into contact with the outside air, to the back-side outer surface layer L3 easier than heat generated by the coil patterns 4a and 4b in the front-side outer surface layer L1. Heat emitted from the inner layer L2 is dissipated outwardly from the back-side outer surface layer L3 through the heat sink 10 and thus filling the board 3 with heat can be difficult.

Next, structures of a magnetic device 1' and a printed circuit board 3' with integrated coil (simply referred to as "board 3'" below) included in the magnetic device 1' according to a second embodiment will be described with reference to FIGS. 5(a) to 6.

FIGS. 5(a) and 5(b) are plan views of layers in the board 3'. FIG. 6 is a cross-sectional view of the magnetic device 1' and illustrates a Z-Z cross-section in FIGS. 5(a) and 5(b).

Figure 6:
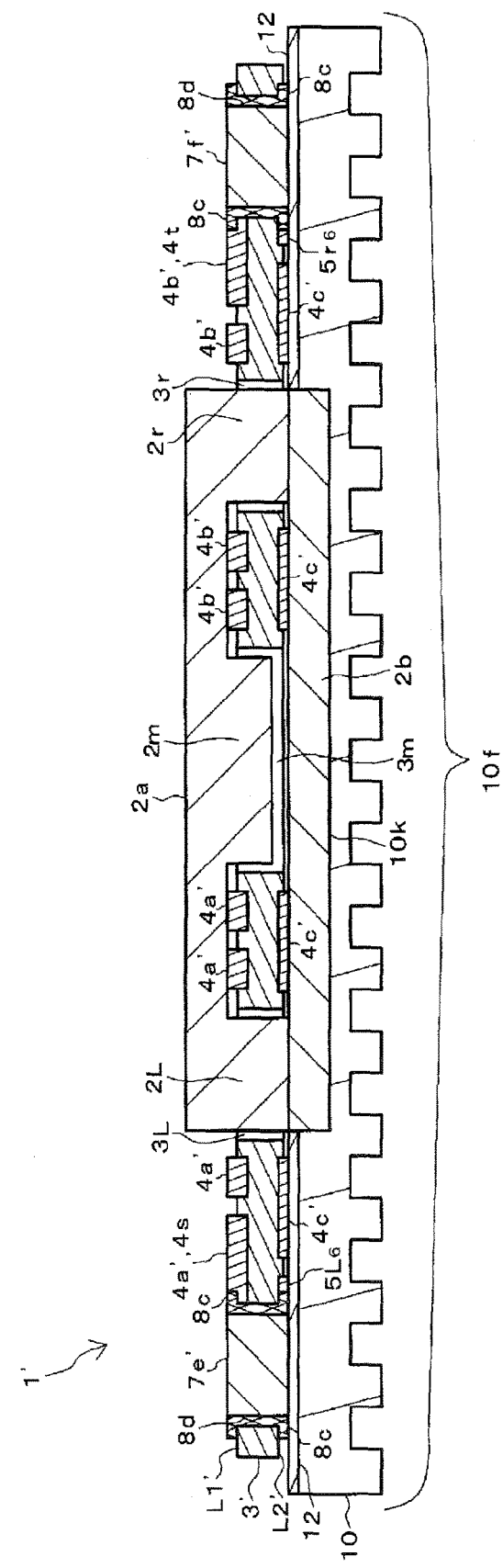
FIG. 6 is a cross-sectional view of the magnetic device in FIG. 5.

The board 3' is formed of a two-layer thick copper foil board in which a front-side outer surface layer L1' as illustrated in FIG. 5(a) is provided on a front surface (upper surface in FIG. 6), and a back-side outer surface layer L2' as illustrated in FIG. 5(b) is provided on a back surface (lower surface in FIG. 6).

As illustrated in FIG. 6, the convex portions 2m, 2L, and 2r of the upper core 2a are respectively inserted into through holes 3m, 3L, and 3r of the board 3' so as to pass through layers L1' and L2'. The heat sink 10 is fixed to the back-side outer surface layer L2' side of the board 3' in a proximity state by the screw 11. The insulating sheet 12 is interposed between the board 3' and the heat sink 10.

As illustrated in FIG. 5, conductors such as the through holes 8a and 8d, through hole groups 9a' and 9b', the pads $8b$ and $8c$, the terminals $6i$ and $6o$, patterns $4a'$ to $4c'$, $5L_1$ to $5L_7$, and $5r_1$ to $5r_7$, and pins $7a'$ to $7f'$ are provided in the board $3'$. The through holes $8a$ and $8d$, and the through hole groups $9a'$ and $9b'$ connect the patterns $4a'$ to $4c'$, $5L_5$ to $5L_7$, and $5r_5$ to $5r_7$ in the layer $L1'$ and the patterns $4a'$ to $4c'$, $5L_5$ to $5L_7$, and $5r_5$ to $5r_7$ in the layer $L2'$ different from the layer $L1'$.

In detail, the through hole $8a$ passes through the board $3'$ so as to connect the patterns $4a'$ and $4b'$ in the front-side outer surface layer $L1'$ with the back-side outer surface layer $L2'$. As illustrated in FIG. 6, the through hole $8d$ passes through the board $3'$ so as to connect the front-side outer surface layer $L1'$ and the back-side outer surface layer $L2'$, or to connect the patterns $4a'$ and $4b'$ in the front-side outer surface layer $L1'$ with patterns $5L_5$ to $5L_7$ and $5r_5$ to $5r_7$ in the back-side outer surface layer $L2'$.

Each of the through hole groups $9a'$ and $9b'$ has a diameter smaller than that of the through holes $8a$ and $8d$. A plurality of through holes passing through the board $3'$ are configured by gathering the through holes at a predetermined interval. The through hole group $9a'$ connects the pattern $4a'$ in the front-side outer surface layer $L1'$ and the pattern $4c'$ in the back-side outer surface layer $L2'$. The through hole group $9b'$ connects the pattern $4b'$ in the front-side outer surface layer $L1'$ and the pattern $4c'$ in the back-side outer surface layer $L2'$.

The coil patterns $4a'$ to $4c'$ and the heat-dissipation patterns $5L_1$ to $5L_7$ and $5r_1$ to $5r_7$ are formed in the layers $L1'$ and $L2'$. These patterns $4a'$ to $4c'$, $5L_1$ to $5L_7$, and $5r_1$ to $5r_7$ are formed of copper foils. Insulating processing is performed on front surfaces of these patterns. A layout of the layers $L1'$ and $L2'$ is plane symmetry. The width, the thickness, or the cross-sectional area of the coil patterns $4a'$ to $4c'$ is set to achieve predetermined performance of a coil and to suppress heat quantities in the coil patterns $4a'$ to $4c'$ up to a certain extent and enable heat dissipation from the front surfaces of the coil patterns $4a'$ to $4c'$ even when a predetermined high current (for example, DC 150 A) flows.

As illustrated in FIG. 5(a), the coil pattern $4a'$ is wound twice in the four directions of the surroundings of the convex portion $2L$ in the front-side outer surface layer $L1'$. The coil pattern $4b'$ is wound twice in the four directions of the surroundings of the convex portion $2r$.

As illustrated in FIG. 5(b), the coil pattern $4c'$ in the back-side outer surface layer $L2'$ is wound once in the four directions of the surroundings of the convex portion $2L$, passes through in three directions of surroundings of the convex portion $2m$, and then is wound once in the four directions of the surroundings of the convex portion $2r$.

One end of the coil pattern $4a'$ and one end of the coil pattern $4c'$ are connected to each other by using the through hole group $9a'$. Another end of the coil pattern $4c'$ and one end of the coil pattern $4b'$ are connected to each other by using the through hole group $9b'$.

Copper plating may be performed on the front surface of each of through holes which have a small diameter and constitutes the through hole groups $9a'$ and $9b'$. Copper and the like may be buried in the through hole. The through hole groups $9a'$ and $9b'$ are an example of "electrical inter-layer connection means" according to the present invention.

Another end of the coil pattern $4a'$ is connected to the terminal $6i$ through the pad $8b$ and the through hole $8a$. Another end of the coil pattern $4b'$ is connected to the terminal $6o$ through the pad $8b$ and the through hole $8a$.

That is, after the coil patterns $4a'$ to $4c'$ of the board $3'$ are wound firstly and secondly around the convex portion $2L$ from the terminal $6i$ which is a starting point, the coil patterns $4a'$ to $4c'$ of the board $3'$ are connected to the back-side outer surface layer $L2'$ through the through hole group $9a'$, in the front-side outer surface layer $L1'$.

Then, after the coil patterns $4a'$ to $4c'$ are wound thirdly around the convex portion $2L$ and wound fourthly around the convex portion $2r$ through a circumference of the convex portion $2m$, the coil patterns $4a'$ to $4c'$ are connected to the front-side outer surface layer $L1'$ through the through hole group $9b'$, in the back-side outer surface layer $L2'$. After the coil patterns $4a'$ to $4c'$ are wound fifthly and sixthly around the convex portion $2r$ in the front-side outer surface layer $L1'$, the coil patterns $4a'$ to $4c'$ are connected to the terminal $6o$ which is an ending point.

As described above, a current flowing in the magnetic device $1'$ also flows in an order of the terminal $6i$, the coil pattern $4a'$, the through hole group $9a'$, the coil pattern $4c'$, the through hole group $9b'$, the coil pattern $4b'$, and the terminal $6o$.

The heat-dissipation patterns $5L_1$ to $5L_7$ and $5r_1$ to $5r_7$ are formed in certain free spaces around the coil patterns $4a'$ to $4c'$ in the layers $L1'$ and $L2'$, so as to be separate from the patterns $4a'$ to $4c'$. The heat-dissipation patterns $5L_1$ to $5L_7$ and $5r_1$ to $5r_7$ are separated from each other. That is, each of the heat-dissipation patterns $5L_1$ to $5L_7$ and $5r_1$ to $5r_7$ is separated from the coil patterns $4a'$ to $4c'$ and other heat-dissipation patterns $5L_1$ to $5L_7$ and $5r_1$ to $5r_7$. The pads $8b$, the terminals $6i$ and $6o$, the through hole $3a$, and the screws $11$ are insulated from the heat-dissipation patterns $5L_1$ to $5L_7$ and $5r_1$ to $5r_7$.

Heat-dissipation pins $7a'$ to $7f'$ are respectively buried into a plurality of through holes $8d$ having a large diameter. The heat-dissipation pins $7a'$ to $7f'$ are formed of metallic pins which are formed to have a columnar shape by using a conductor of copper or the like. The pads $8c$ formed of a copper foil are provided around the heat-dissipation pins $7a'$ to $7f'$ in the layers $L1'$ and $L2'$. Copper plating is performed on front surfaces of the heat-dissipation pins $7a'$ to $7f'$ or the pads $8c$. Lower ends of the heat-dissipation pins $7a'$ to $7f'$ come into contact with the insulating sheet $12$ (see FIG. 6). The heat-dissipation pins $7a'$ to $7f'$, the pads $8c$ around the heat-dissipation pins $7a'$ to $7f'$, and the through hole $8d$ are an example of "thermal inter-layer connection means" according to the present invention.

As illustrated in FIG. 5(a), in the front-side outer surface layer $L1'$, width expansion portions $4s$ and $4t$ are respectively provided at a portion of the coil pattern $4a'$ and at a portion of the coil pattern $4b'$. The heat-dissipation pins $7a'$, $7c'$, and $7e'$, the pads $8c$ around the heat-dissipation pins $7a'$, $7c'$, and $7e'$, and the through holes $8d$ are connected to the width expansion portion $4s$ of the coil pattern $4a'$. The heat-dissipation pins $7b'$, $7d'$, and $7f'$, the pads $8c$ around the heat-dissipation pins $7b'$, $7d'$, and $7f'$, and the through holes $8d$ are connected to the width expansion portion $4t$ of the coil pattern $4b'$. The coil patterns $4a'$ and $4b'$, the heat-dissipation pins $7a'$ to $7f'$, the pads $8c$, and the through holes $8d$ are insulated from the heat-dissipation patterns $5L_1$ to $5L_4$ and $5r_1$ to $5r_4$.

As illustrated in FIG. 5(b), heat-dissipation patterns $5L_5$ to $5L_7$ are provided in the back-side outer surface layer $L2'$ so as to correspond to the coil pattern $4a'$ in the front-side outer surface layer $L1'$. Heat-dissipation patterns $5r_5$ to $5r_7$ are provided in the back-side outer surface layer $L2'$ so as to correspond to the coil pattern $4b'$.

The heat-dissipation pin $7c'$, the pad $8c$ around the heat-dissipation pin $7c'$, and the through hole $8d$ are connected to the heat-dissipation pattern $5L_5$ in the back-side outer surface layer $L2'$. The heat-dissipation pin $7e'$, the pad $8c$ around the heat-dissipation pin 7e', and the through hole 8d are connected to the heat-dissipation pattern $5L_6$. The heat-dissipation pin 7a', the pad 8c around the heat-dissipation pin 7a', and the through hole 8d are connected to the heat-dissipation pattern $5L_7$.

The heat-dissipation pin 7d', the pad 8c around the heat-dissipation pin 7d', and the through hole 8d in the back-side outer surface layer L2' are connected to the heat-dissipation pattern $5r_5$. The heat-dissipation pin 7f', the pad 8c around the heat-dissipation pin 7f', and the through hole 8d are connected to the heat-dissipation pattern $5r_6$. The heat-dissipation pin 7b', the pad 8c around the heat-dissipation pin 7b', and the through hole 8d are connected to the heat-dissipation pattern $5r_7$.

The coil pattern 4c' is insulated from the heat-dissipation patterns $5L_5$ to $5L_7$ and $5r_5$ to $5r_7$ in the back-side outer surface layer L2'. The coil pattern 4c' is insulated from the heat-dissipation pins 7a' to 7f', the pads 8c, and the through holes 8d.

With the above descriptions, the coil pattern 4a' in the front-side outer surface layer L1' and the heat-dissipation patterns $5L_5$ to $5L_7$ in the back-side outer surface layer L2' are connected to each other by using the heat-dissipation pins 7c', 7e', and 7a', the pads 8c around the heat-dissipation pins 7c', 7e', and 7a', and the through holes 8d. The coil pattern 4b' in the front-side outer surface layer L1' and the heat-dissipation patterns $5r_5$ to $5r_7$ in the back-side outer surface layer L2' are connected to each other by using the heat-dissipation pins 7d', 7f', and 7b', the pads 8c around the heat-dissipation pins 7d', 7f', and 7b', and the through holes 8d. That is, the coil patterns 4a' and 4b' in the front-side outer surface layer L1' are respectively connected to the corresponding heat-dissipation patterns $5L_5$ to $5L_7$ and $5r_5$ to $5r_7$ at three places in the back-side outer surface layer L2'.

Since a high current flows in the coil patterns 4a' to 4c', the coil patterns 4a' to 4c' function as a heat generation source, and thus the temperature of the board 3' rises. In the front-side outer surface layer L1', heat of the board 3' is diffused to the heat-dissipation patterns $5L_1$ to $5L_4$ and $5r_1$ to $5r_4$, and is dissipated on the front surfaces of the conductors such as the patterns 4a', 4b', $5L_1$ to $5L_4$, and $5r_1$ to $5r_4$. Heat of the board 3' is transferred to the conductors passing through the board 3', such as the heat-dissipation pins 7a' to 7f', the through holes 8d and 8a, and the through hole groups 9a' and 9b', and thus the heat is dissipated through the insulating sheet 12 by the heat sink 10. The through hole groups 9a' and 9b' function as thermal vias.

Heat quantities at portions of the coil patterns 4a' and 4b' at which the width is narrow are greater than those at other portions. Heat generated by the coil patterns 4a' and 4b' is transferred to the heat-dissipation pins 7a' to 7f' and the like and is diffused to the heat-dissipation patterns $5L_1$ to $5L_4$ and $5r_1$ to $5r_4$ in the back-side outer surface layer L2'. Thus, the heat is dissipated from front surfaces of the heat-dissipation patterns $5L_1$ to $5L_4$ and $5r_1$ to $5r_4$ or lower surfaces of the heat-dissipation pins 7a' to 7f', through the insulating sheet 12 by the heat sink 10.

In the back-side outer surface layer L2', heat of the board 3' is diffused to the heat-dissipation patterns $5L_5$ to $5L_7$ and $5r_5$ to $5r_7$, and is dissipated from front surfaces of the conductors such as the patterns 4c', $5L_5$ to $5L_7$, and $5r_5$ to $5r_7$, through the insulating sheet 12 by the heat sink 10. Particularly, heat generated by the coil pattern 4c' is dissipated from the front surface of the coil pattern 4c' through the insulating sheet 12 by the heat sink 10.

According to the second embodiment, heat generated by the coil patterns 4a' and 4b' in the front-side outer surface layer L1' of the board 3' is dissipated from the front surfaces of the coil patterns 4a' and 4b', and is transferred to the heat-dissipation patterns $5L_5$ to $5L_7$ and $5r_5$ to $5r_7$ in the back-side outer surface layer L2' by the thermal inter-layer connection means such as the heat-dissipation pins 7a' to 7f'. Thus, the heat is transferred to the heat sink 10 from the front surfaces of the heat-dissipation patterns $5L_5$ to $5L_7$ and $5r_5$ to $5r_7$, and is dissipated by the heat sink 10. Heat generated by the coil pattern 4c' in the back-side outer surface layer L2' is transferred to the heat sink 10 from the front surface of the pattern 4c' and is dissipated by the heat sink 10.

Thus, it is possible to easily dissipate heat emitted from the coil patterns 4a' to 4c' outwardly. As a result, since heat generation by the coil patterns 4a' to 4c' is allowed, the coil patterns 4a' to 4c' may not be largely widened in a plate face direction of the board 3', and it is possible to avoid increasing of the sizes of the board 3' and the magnetic device 1'.

The coil patterns 4a' to 4c' in the layer L1' are connected to the coil patterns 4a' to 4c' in the layer L2' different from the layer L1' by using the through hole groups 9a' and 9b'. The coil patterns 4a' to 4c' and the heat-dissipation patterns $5L_5$ to $5L_7$ and $5r_5$ to $5r_7$ are connected to each other by using the heat-dissipation pins 7a' to 7f' and the like. The coil pattern 4c' is insulated from the heat-dissipation patterns $5L_5$ to $5L_7$ and $5r_5$ to $5r_7$. For this reason, it is possible to reliably distinguish between an electrification path and a heat-dissipation path for the coil patterns 4a' to 4c'.

Next, structures of a magnetic device 1" and a printed circuit board 3" with integrated coil (simply referred to as "board 3'" below) included in the magnetic device 1' according to a third embodiment will be described with reference to FIGS. 7(a) to 8.

FIGS. 7(a) and 7(b) are plan views of layers in the board 3". FIG. 8 is a cross-sectional view of the magnetic device 1" and illustrates a V-V cross-section in FIGS. 7(a) and 7(b).

Figure 8:
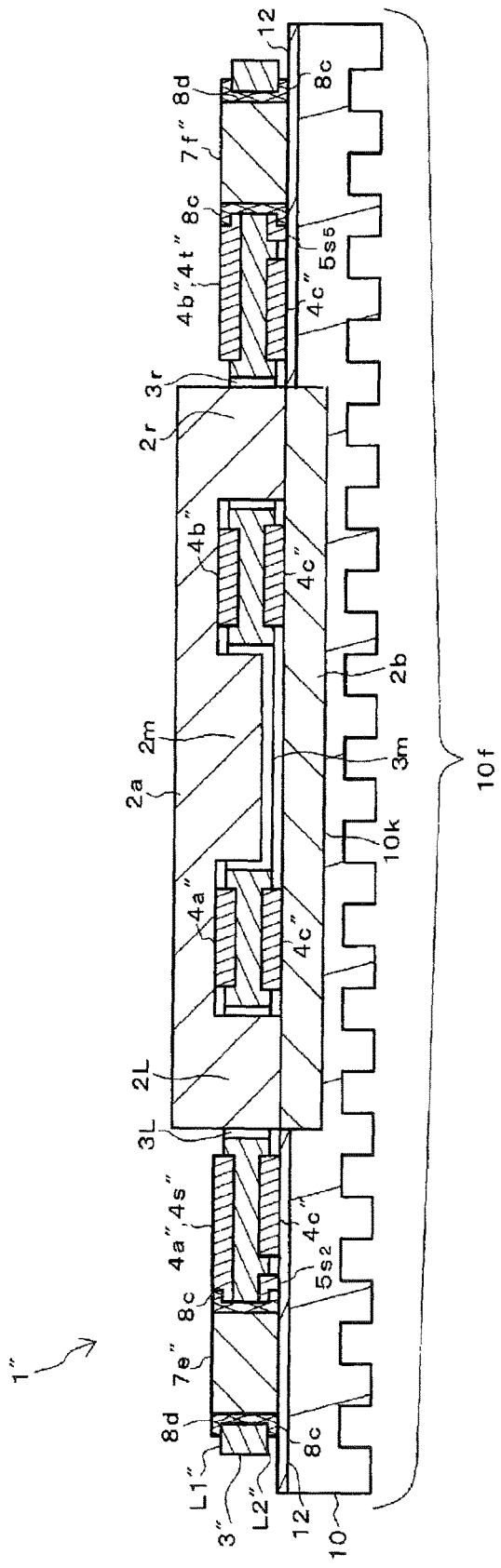
FIG. 8 is a cross-sectional view of the magnetic device in FIG. 7.

The board 3" is formed of a two-layer thick copper foil board in which a front-side outer surface layer L1" as illustrated in FIG. 7(a) is provided on a front surface (upper surface in FIG. 8), and a back-side outer surface layer L2" as illustrated in FIG. 7(b) is provided on a back surface (lower surface in FIG. 8).

As illustrated in FIG. 8, the convex portions 2m, 2L, and 2r of the upper core 2a are respectively inserted into through holes 3m, 3L, and 3r of the board 3" so as to pass through layers L1' and L2". The heat sink 10 is fixed to the back-side outer surface layer L2" side of the board 3" in a proximity state by the screw 11 (FIGS. 7(a) and 7(b)). The insulating sheet 12 is interposed between the board 3" and the heat sink 10.

As illustrated in FIGS. 7(a) and 7(b), conductors such as the through holes 8a and 8d, through hole groups 9a" and 9b", the pads 8b and 8c, the terminals 6i and 6o, patterns 4a" to 4c", 4u, and $5s_0$ to $5s_6$, and pins 7a" to 7f" are provided in the board 3". The through holes 8a and 8d, and the through hole groups 9a" and 9b" connect the patterns 4a" to 4c", and $5s_1$ to $5s_6$ in the layer L1" and the patterns 4a" to 4c", and $5s_1$ to $5s_6$ in the layer L2" different from L1".

In detail, the through hole 8a passes through the board 3" so as to connect the patterns 4a" and 4b" in the front-side outer surface layer L1" with the back-side outer surface layer L2". As illustrated in FIG. 8, the through hole 8d passes through the board 3" so as to connect the front-side outer surface layer L1" and the back-side outer surface layer L2", or to connect the patterns 4a" and 4b" in the front-side outer surface layer L1" with patterns $5s_1$ to $5s_6$ in the back-side outer surface layer L2".

Each of the through hole groups $9a''$ and $9b''$ has a diameter smaller than that of the through holes $8a$ and $8d$. A plurality of through holes passing through the board $3''$ are configured by gathering the through holes at a predetermined interval. The through hole group $9a''$ connects the pattern $4a''$ in the front-side outer surface layer $L1''$ and the pattern $4c''$ in the back-side outer surface layer $L2''$. The through hole group $9b''$ connects the pattern $4b''$ in the front-side outer surface layer $L1''$ and the pattern $4c''$ in the back-side outer surface layer $L2''$.

The coil patterns $4a''$ to $4c''$ and the heat-dissipation patterns $5s_0$ to $5s_6$ and $4u$ are formed in the layers $L1''$ and $L2''$. These patterns $4a''$ to $4c''$, $4u$, and $5s_0$ to $5s_6$ are formed of copper foils. Insulating processing is performed on front surfaces of these patterns. A layout of the layers $L1''$ and $L2''$ is plane symmetry. The width, the thickness, or the cross-sectional area of the coil patterns $4a''$ to $4c''$ is set to achieve predetermined performance of a coil and to suppress heat quantities in the coil patterns $4a''$ to $4c''$ up to a certain extent and enable heat dissipation from the front surfaces of the coil patterns $4a''$ to $4c''$ even when a predetermined high current (for example, DC 150 A) flows.

As illustrated in FIG. 7(a), the coil pattern $4a''$ is formed in the front-side outer surface layer $L1''$ by performing winding in the four directions of the surroundings of the convex portion $2L$ once. The coil pattern $4b''$ is wound once in the four directions of the surroundings of the convex portion $2r$.

As illustrated in FIG. 7(b), the coil pattern $4c''$ is formed in the back-side outer surface layer $L2''$ by performing winding in the four directions of the surroundings of the convex portion $2L$ once, passing through in three directions of surroundings of the convex portion $2m$, and then performing winding in the four directions of the surroundings of the convex portion $2r$ once.

One end of the coil pattern $4a''$ and one end of the coil pattern $4c''$ are connected to each other by using a plurality of through hole group $9a''$ having a small diameter. Another end of the coil pattern $4c''$ and one end of the coil pattern $4b''$ are connected to each other by using a plurality of through hole group $9b''$ having a small diameter.

Copper plating may be performed on the front surface of each of through holes which have a small diameter and constitutes the through hole groups $9a''$ and $9b''$. Copper and the like may be buried in the through hole. The through hole groups $9a''$ and $9b''$ are an example of "electrical inter-layer connection means" according to the present invention.

Another end of the coil pattern $4a''$ is connected to the terminal $6i$ through the pad $8b$ and the through hole $8a$. Another end of the coil pattern $4b''$ is connected to the terminal $6o$ through the pad $8b$ and the through hole $8a$.

That is, after the coil patterns $4a''$ to $4c''$ of the board $3''$ are wound firstly around the convex portion $2L$ from the terminal $6i$ which is a starting point, in the front-side outer surface layer $L1''$, the coil patterns $4a''$ to $4c''$ of the board $3'$ are connected to the back-side outer surface layer $L2''$ through the through hole group $9a'$.

Then, after the coil patterns $4a''$ to $4c''$ are wound secondly around the convex portion $2L$ and wound thirdly around the convex portion $2r$ through a circumference of the convex portion $2m$ in the back-side outer surface layer $L2''$, the coil patterns $4a''$ to $4c''$ are connected to the front-side outer surface layer $L1''$ through the through hole group $9b''$. After the coil patterns $4a''$ to $4c''$ are wound fourthly around the convex portion $2r$ in the front-side outer surface layer $L1''$, the coil patterns $4a''$ to $4c''$ are connected to the terminal $6o$ which is an ending point.

As described above, a current flowing in the magnetic device $1''$ also flows in an order of the terminal $6i$, the coil pattern $4a''$, the through hole group $9a''$, the coil pattern $4c''$, the through hole group $9b''$, the coil pattern $4b''$, and the terminal $6o$.

As illustrated in FIG. 7(a), a plurality (eight) of heat-dissipation patterns $5s_0$ are formed in certain free spaces of surroundings of the coil patterns $4a''$ and $4b''$ in the front-side front surface layer $L1''$ so as to be separate from the coil patterns $4a''$ and $4b''$. The heat-dissipation patterns $5s_0$ are separate from each other. The pad $8b$, the terminals $6i$ and $6o$, the through hole $3a$, and the screw $11$ are insulated from the heat-dissipation patterns $5s_0$.

As illustrated in FIG. 7(b), the heat-dissipation pattern $5s_1$ to $5s_6$ are formed in a certain free space of surrounding of the coil pattern $4c''$ in the back-side front surface layer $L2''$ so as to be separate from the coil pattern $4c''$. The heat-dissipation patterns $5s_1$ to $5s_3$ are an example of a "first heat-dissipation pattern" according to the present invention.

The width of a portion of the coil pattern $4c''$ in the back-side outer surface layer $L2''$ is expanded, and thus a plurality (four) of heat-dissipation patterns $4u$ are formed so as to be integrated with the coil pattern $4c''$. That is, the heat-dissipation patterns $4u$ are connected to the coil pattern $4c''$. The heat-dissipation patterns $4u$ are an example of a "second heat-dissipation pattern" according to the present invention.

The heat-dissipation patterns $5s_1$ to $5s_6$ and $4u$ are separate from each other. The pad $8b$, the terminals $6i$ and $6o$, the through hole $3a$, and the screw $11$ are insulated from the heat-dissipation patterns $5s_1$ to $5s_6$ and $4u$.

Heat-dissipation pins $7a''$ to $7f''$ are respectively buried into a plurality of through holes $8d$ having a large diameter. The heat-dissipation pins $7a''$ to $7f''$ are formed of metallic pins which are formed to have a columnar shape by using a conductor of copper or the like. The pads $8c$ formed of a copper foil are provided around the heat-dissipation pins $7a''$ to $7f''$ in the layers $L1''$ and $L2''$. Copper plating is performed on front surfaces of the heat-dissipation pins $7a''$ to $7f''$ or the pads $8c$. Lower ends of the heat-dissipation pins $7a''$ to $7f''$ come into contact with heat sink $10$ through the insulating sheet $12$ (see FIG. 8). The heat-dissipation pins $7a''$ to $7f''$, the pads $8c$ around the heat-dissipation pins $7a''$ to $7f''$, and the through hole $8d$ are an example of "thermal inter-layer connection means" according to the present invention.

As illustrated in FIG. 7(a), in the front-side outer surface layer $L1''$, width expansion portions $4s''$ and $4t''$ are respectively provided at a portion of the coil pattern $4a''$ and at a portion of the coil pattern $4b''$. The heat-dissipation pins $7a''$, $7c''$, and $7e''$, the pads $8c$ around the heat-dissipation pins $7a''$, $7c''$, and $7e''$, and the through holes $8d$ are connected to the width expansion portion $4s''$ of the coil pattern $4a''$. The heat-dissipation pins $7b''$, $7d''$, and $7f''$, the pads $8c$ around the heat-dissipation pins $7b''$, $7d''$, and $7f''$, and the through holes $8d$ are connected to the width expansion portion $4t''$ of the coil pattern $4b''$. The coil patterns $4a''$ and $4b''$, the heat-dissipation pins $7a''$ to $7f''$, the pads $8c$, and the through holes $8d$ are insulated from the heat-dissipation patterns $5s_0$.

As illustrated in FIG. 7(b), heat-dissipation patterns $5s_1$ to $5s_3$ are provided in the back-side outer surface layer $L2''$ so as to correspond to the coil pattern $4a''$ in the front-side outer surface layer $L1''$. Heat-dissipation patterns $5s_4$ to $5s_6$ are provided in the back-side outer surface layer $L2''$ so as to correspond to the coil pattern $4b''$.

The heat-dissipation pin $7c''$, the pad $8c$ around the heat-dissipation pin $7c''$, and the through hole $8d$ are connected to the heat-dissipation pattern $5s_1$ in the back-side outer surface layer L2". The heat-dissipation pin 7e", the pad 8c around the heat-dissipation pin 7e", and the through hole 8d are connected to the heat-dissipation pattern $5s_2$. The heat-dissipation pin 7a", the pad 8c around the heat-dissipation pin 7a", and the through hole 8d are connected to the heat-dissipation pattern $5s_3$.

The heat-dissipation pin 7d", the pad 8c around the heat-dissipation pin 7d", and the through hole 8d in the back-side outer surface layer L2" are connected to the heat-dissipation pattern $5s_4$. The heat-dissipation pin 7f", the pad 8c around the heat-dissipation pin 7f", and the through hole 8d are connected to the heat-dissipation pattern $5s_5$. The heat-dissipation pin 7b", the pad 8c around the heat-dissipation pin 7b", and the through hole 8d are connected to the heat-dissipation pattern $5s_6$.

The coil pattern 4c" is insulated from the heat-dissipation patterns $5s_1$ to $5s_6$ in the back-side outer surface layer L2". The coil pattern 4c" is insulated from the heat-dissipation pins 7a" to 7f", the pads 8c, and the through holes 8d.

With the above descriptions, the coil pattern 4a" in the front-side outer surface layer L1" and the heat-dissipation patterns $5s_1$ to $5s_3$ in the back-side outer surface layer L2" are connected to each other by using the heat-dissipation pins 7c", 7e", and 7a", the pads 8c around the heat-dissipation pins 7c", 7e", and 7a", and the through holes 8d. The coil pattern 4b" in the front-side outer surface layer L1" and the heat-dissipation patterns $5s_4$ to $5s_6$ in the back-side outer surface layer L2" are connected to each other by using the heat-dissipation pins 7d", 7f", and 7b", the pads 8c around the heat-dissipation pins 7d", 7f", and 7b", and the through holes 8d.

As illustrated in FIGS. 7(a) and 7(b), the total area of the coil patterns 4a" and 4b" in the front-side outer surface layer L1" and the heat-dissipation patterns $5s_1$ to $5s_6$ in the back-side outer surface layer L2" corresponding to the coil patterns 4a" and 4b" is larger than an area (including an area of the heat-dissipation pattern 4u) of the coil pattern 4c" in the back-side outer surface layer L2". The total area of the heat-dissipation patterns $5s_1$ to $5s_6$ is larger than the total area of the heat-dissipation patterns 4u.

Since a high current flows in the coil patterns 4a" to 4c", the coil patterns 4a" to 4c" function as a heat generation source, and thus the temperature of the board 3" rises. In the front-side outer surface layer L1", heat of the board 3" is diffused to the heat-dissipation pattern $5s_0$, and is dissipated on the front surfaces of the conductors such as the patterns 4a", 4b", and $5s_0$. Heat of the board 3" is transferred to the conductors passing through the board 3", such as the heat-dissipation pins 7a" to 7f", the through holes 8d and 8a, and the through hole groups 9a" and 9b", and thus is dissipated through the insulating sheet 12 by the heat sink 10. Particularly, heat generated by the coil patterns 4a" and 4b" is transferred to the heat-dissipation pins 7a" to 7f" and the like, and thus is diffused to the heat-dissipation patterns $5s_1$ to $5s_6$ in the back-side outer surface layer L2". The heat is dissipated from front surfaces of the heat-dissipation patterns $5s_1$ to $5s_6$ and lower surfaces of the heat-dissipation pins 7a" to 7l" through the insulating sheet 12 by the heat sink 10.

In the back-side outer surface layer L2", heat of the board 3" is diffused to the heat-dissipation patterns $5s_1$ to $5s_6$, and is dissipated from front surfaces of the conductors such as the patterns 4c", 4u, and $5s_1$ to $5s_6$ by the heat sink 10 through the insulating sheet 12. Particularly, heat generated by the coil pattern 4c" is diffused to the heat-dissipation pattern 4u, and is dissipated from the front surface of the coil patterns 4c" and 4u through the insulating sheet 12 by the heat sink 10.

According to the third embodiment, heat generated by the coil patterns 4a" and 4b" in the front-side outer surface layer L1" of the board 3" is dissipated from the front surfaces of the coil patterns 4a" and 4b", and is transferred to the heat-dissipation patterns $5s_1$ to $5s_6$ in the back-side outer surface layer L2" by the thermal inter-layer connection means such as the heat-dissipation pins 7a" to 7f". Thus, the heat is transferred to the heat sink 10 from the front surfaces of the heat-dissipation patterns $5s_1$ to $5s_6$, and is dissipated by the heat sink 10. Heat generated by the coil pattern 4c" in the back-side outer surface layer L2" is diffused to the heat-dissipation pattern 4u, transferred to the heat sink 10 from the front surface of the patterns 4c" and 4u, and thus the heat is dissipated by the heat sink 10.

Thus, it is possible to easily dissipate heat emitted from the coil patterns 4a" to 4c" outwardly. As a result, since heat generation by the coil patterns 4a" to 4c" is allowed, the coil patterns 4a" to 4c" may not be largely widened in a plate face direction of the board 3", and it is possible to avoid increasing of the sizes of the board 3" and the magnetic device 1".

The coil patterns 4a" to 4c" in the layer L1" are connected to the coil patterns 4a" to 4c" in the layer L2" different from the layer L1" by using the through hole groups 9a" and 9b". The coil patterns 4a" to 4c" and the heat-dissipation patterns $5s_1$ to $5s_6$ are connected to each other by using the heat-dissipation pins 7a" to 7f" and the like. The coil pattern 4c" is insulated from the heat-dissipation patterns $5s_1$ to $5s_6$. For this reason, it is possible to reliably distinguish between an electrification path and a heat-dissipation path for the coil patterns 4a" to 4c".

The total area of the coil patterns 4a" and 4b" in the front-side outer surface layer L1" and the heat-dissipation patterns $5s_1$ to $5s_6$ in the back-side outer surface layer L2" connected to the coil patterns 4a" and 4b" is larger than an area of the coil pattern 4c" in the back-side outer surface layer L2". The total area of the heat-dissipation pattern $5s_1$ to $5s_6$ is larger than the total area of the heat-dissipation patterns 4u. For this reason, even when the heat sink 10 is not provided on the front-side front surface layer L1" of the board 3", it is possible to easily dissipate heat generated by the coil patterns 4a" and 4b" in the front-side front surface layer L1" from the front surfaces of the patterns 4a", 4b", and $5s_0$ in the front-side front surface layer L1" or the heat sink 10 close to the patterns $5s_1$ to $5s_6$ in the back-side front surface layer L2". It is possible to easily dissipate heat generated by the coil pattern 4c" in the back-side front surface layer L2" from the pattern 4c" or the heat-dissipation patterns 4u through the heat sink 10.

In the present invention, various embodiments can be employed in addition to the above descriptions. For example, in the above embodiments, examples in which the coil patterns 4a to 4e, 4a' to 4c', and 4a" to 4c" are respectively formed in the layers L1 to L3, L1' and L2', and L1", L2" of all of the boards 3, 3', and 3" are described. However, the present invention is not limited to only these examples. In a board having a plurality of layers, coil patterns may be formed in an outer surface layer in which heat-dissipation patterns are provided, and at least one layer other than the outer surface layer.

In the above embodiments, examples in which the coil patterns 4a to 4e, 4a' to 4c', and 4a" to 4c" are respectively formed in the boards 3, 3', and 3" so as to be wound around the three convex portions 2m, 2L, and 2r of the core 2a are described. However, the present invention is not limited to only these examples. The coil patterns may be wound around at least one convex portion of the core.

In the above embodiments, examples in which the heat-dissipation patterns $5a_7$ to $5a_9$, $5b_7$ to $5b_9$, $5L_5$ to $5L_7$, $5r_5$ to $5r_7$, and $5s_1$ to $5s_6$ are respectively provided in the outer surface layers L3, L2', and L2" on the back side of the boards 3, 3', and 3" so as to correspond to the coil patterns 4a to 4d, 4a', 4b', 4a", and 4b" in other layers L1, L2, L1', and L1" are described. However, the present invention is not limited to only these examples. In addition, the heat-dissipation patterns may be provided in both of the outer surface layers on the front side and the back side of the board so as to correspond to coil patterns in an inner layer.

In the above embodiments, examples in which the coil patterns 4a to 4d, 4a', 4b', 4a", and 4b" and the heat-dissipation patterns $5a_7$ to $5a_9$, $5b_7$ to $5b_9$, $5L_5$ to $5L_7$, $5r_5$ to $5r_7$, and $5s_1$ to $5s_6$ which correspond to each other in different layers L1 to L3, L1' and L2', L1", and L2" are connected by using the heat-dissipation pins 7a to 7f, 7a' to 7f', and 7a" to 7f", the pads 8c, and the through holes 8d are described. However, the present invention is not limited to only these examples. In addition, the coil patterns and the heat-dissipation patterns which correspond to each other in different layers may be connected to each other by at least one thermal inter-layer connection means of, for example, the terminals, the pins, and the through holes.

In the first embodiment illustrated in FIG. 3 and the like, an example in which the diameters of the thermal inter-layer connection means such as the heat-dissipation pins 7a to 7f, which thermally connect the coil patterns 4a to 4d in the front-side outer surface layer L1 or the inner layer L2 with the heat-dissipation patterns $5a_7$ to $5a_9$ and $5b_7$ to $5b_9$ in the back-side outer surface layer L3 are the same. However, the present invention is not limited to only this example. In addition, as in a printed circuit board with integrated coil 33 (simply referred to as "board 33" below) according to a fourth embodiment illustrated in FIGS. 9(a) to 9(c), the diameters of the thermal inter-layer connection means such as the heat-dissipation pins 37a to 37f may be different from each other.

In the board 33 illustrated in FIGS. 9(a) to 9(c), heat-dissipation pins 37a to 37f are respectively buried into each of through holes 8d and 8d'. The heat-dissipation pins 37a to 37f are formed of metallic pins which are formed to have a columnar shape by using a conductor of copper or the like. Each of diameters of the heat-dissipation pins 37c, 37d, 37e, and 37f, the pads 8c around the heat-dissipation pins 37c, 37d, 37e, and 37f, and the through holes 8d is greater than each of diameters of the heat-dissipation pins 37a and 37b, the pads 8c' around the heat-dissipation pins 37a and 37b, and the through hole 8d'. The heat-dissipation pins 37a to 37f, the pads 8c' and 8c around the heat-dissipation pins 37a to 37f, and the through holes 8d' and 8d are an example of the "thermal inter-layer connection means" according to the present invention.

The heat-dissipation pins 37a and 37b, the pads 8c' around the heat-dissipation pins 37a and 37b, and the through holes 8d' thermally connect the coil patterns 4a and 4b in the front-side outer surface layer L1 and the heat-dissipation patterns $5a_9$ and $5b_9$ in the back-side outer surface layer L3. The heat-dissipation pins 37a and 37b, the pads 8c' around the heat-dissipation pins 37a and 37b, and the through holes 8d' are an example of the "first thermal inter-layer connection means" according to the present invention.

The heat-dissipation pins 37c, 37d, 37e, and 37f, the pads 8c around the heat-dissipation pins 37c, 37d, 37e, and 37f, and the through holes 8d thermally connect expanded areas $4t_3$ to $4t_6$ of the coil patterns 4c and 4d in the inner layer L2 and the heat-dissipation patterns $5a_7$, $5a_8$, $5b_7$, and $5b_8$ in the back-side outer surface layer L3. The heat-dissipation pins 37c, 37d, 37e, and 37f, the pads 8c around the heat-dissipation pins 37c, 37d, 37e, and 37f, and the through holes 8d are an example of the "second thermal inter-layer connection means" according to the present invention.

That is, the diameter of the second thermal inter-layer connection means being a columnar body which connects the coil patterns 4c and 4d in the inner layer L2 and the heat-dissipation patterns $5a_7$, $5a_8$, $5b_7$, and $5b_8$ in the back-side outer surface layer L3 is larger than the diameter of the first thermal inter-layer connection means being a columnar body which connects the coil patterns 4a and 4b in the front-side outer surface layer L1 and the heat-dissipation patterns $5a_9$ and $5b_9$ in the back-side outer surface layer L3.

Thus, the volume of transferred heat to the heat-dissipation patterns $5a_7$, $5a_8$, $5b_7$, and $5b_8$ in the back-side outer surface layer L3 from the coil patterns 4c and 4d in the inner layer L2 is larger than the volume of transferred heat to the heat-dissipation patterns $5a_9$ and $5b_9$ in the back-side outer surface layer L3 from the coil patterns 4a and 4b in the front-side outer surface layer L1. For this reason, it is possible to transfer heat generated by the coil patterns 4c and 4d in the inner layer L2 which does not come into contact with the outside air, to the back-side outer surface layer L3 easier than heat generated by the coil patterns 4a and 4b in the front-side outer surface layer L1. Heat emitted from the inner layer L2 is dissipated outwardly from the back-side outer surface layer L3 through the heat sink 10 and thus filling the board 33 with heat can be difficult.

In the above embodiments, examples in which the coil patterns 4a to 4e, 4a', 4b', 4a", and 4b" in the layers L1 to L3, L1' and L2', L1", and L2" are connected to the coil patterns 4a to 4e, 4a', 4b', 4a", and 4b" in different layers L1 to L3, L1' and L2', L1", and L2" by using the through hole groups 9a to 9d, 9a', 9b', 9a", and 9b" are described. However, the present invention is not limited to only these examples. In addition, the coil patterns in the layers different from each other are connected to each other by, for example, using another electrical inter-layer connection means such as the terminal, the pin, and the single through hole.

In the above embodiments, an example of using the heat sink 10 as a heat radiator is described. However, the present invention is not limited to only this example. In addition, an air-cooled heat radiator, a water-cooled heat radiator, a heat radiator using a coolant, and the like may be used. A heat radiator formed of resin having high thermal conductivity may be used in addition to a metallic heat radiator. In this case, the insulating sheet 12 is not necessarily provided between the heat radiator and the board, and thus it is possible to omit the insulating sheet 12. Heat radiators may be respectively provided in both of the outer surface layers of the board, or a heat radiator may be omitted.

In the above embodiments, an example of using a thick copper foil board as the printed circuit board with integrated coil is described. However, the present invention is not limited to only this example. Other boards such as a printed board in which a copper foil having a general thickness is formed, and a metallic board may be used. In a case of the metallic board, an insulating substance may be provided between a base and each of the patterns. In a multiple-layer board in which a plurality of inner layers are provided, the present invention may be also applied.

In the above embodiments, an example in which the I-shaped lower core 2b is combined with the E-shaped upper core 2a is described. However, the present invention may be also applied to a magnetic device having two E-shaped cores which are combined with each other.

In the above embodiments, an example in which the present invention is applied to the magnetic devices 1, 1', and 1" used as the choke coil L of the smoothing circuit 55 in the vehicle switching power supply apparatus 100 is described. However, the present invention may be also applied to a magnetic device used as the transformer 53 (FIG. 1). The present invention may be also applied to a magnetic device used in a switching power supply apparatus for, for example, electronic equipment in addition to a vehicle.

DESCRIPTION OF REFERENCE SIGN(S)

1, 1', 1" MAGNETIC DEVICE
2a UPPER CORE
2b LOWER CORE
3, 3', 3", 33 PRINTED CIRCUIT BOARD WITH INTEGRATED COIL
4a TO 4e, 4a' TO 4c', 4a" TO 4c" COIL PATTERN
4u HEAT-DISSIPATION PATTERN
$5a_7$ TO $5a_9$, $5b_7$ TO $5b_9$, $5L_5$ TO $5L_7$, $5r_5$ TO $5r_7$, $5s_1$ TO $5s_6$ HEAT-DISSIPATION PATTERN
7a TO 7f, 7a' TO 7f', 7a" TO 7f', 37a TO 37f HEAT-DISSIPATION PIN
8d, 8d' THROUGH HOLE
8c, 8c' PAD
9a TO 9d, 9a', 9b', 9a", 9b" THROUGH HOLE GROUP
10 HEAT SINK
L1, L1', L1" FRONT-SIDE OUTER SURFACE LAYER
L2 INNER LAYER
L3, L2', L2" BACK-SIDE OUTER SURFACE LAYER

The invention claimed is:

1. A printed circuit board with integrated coil comprising:
a plurality of layers;
coil patterns which are formed of a conductor and which are provided in at least one outer surface layer and another layer of the plurality of layers;
and a heat-dissipation pattern which is formed of a conductor, and which is provided on at least the one outer surface layer so as to correspond to the coil pattern provided in the another layer, wherein the coil pattern provided in the one outer surface layer and the heat-dissipation pattern provided in the one outer surface layer are separated from each other; and
a thermal inter-layer connector which is formed of a conductor, and which connects the coil pattern provided in the another layer and the heat-dissipation pattern provided in the one outer surface layer which correspond to each other.

2. The printed circuit board with integrated coil according to claim 1, further comprising:
an electrical inter-layer connection connector which is formed of a conductor and which connects the coil patterns in different layers to each other.

3. The printed circuit board with integrated coil according to claim 1,
wherein the plurality of layers comprise a front-side outer surface layer, a back-side outer surface layer, and at least one inner layer provided between the front-side outer surface layer and the back-side outer surface layer, and the coil pattern is provided in each of the layers,
wherein a plurality of heat-dissipation patterns are provided in the back-side outer surface layer so as to correspond to the coil patterns provided in other layers, respectively,
wherein the heat-dissipation patterns provided in the back-side outer surface layer are separated from each other, and the heat-dissipation patterns and the coil pattern provided in the back-side outer surface layer are separated from each other, and
wherein the thermal inter-layer connector comprises:
a first thermal inter-layer connection member which connects the coil pattern in the front-side outer surface layer and the heat-dissipation pattern corresponding to the coil pattern in the front-side outer surface layer, and
a second thermal inter-layer connection member which connects the coil pattern in the inner layer and the heat-dissipation pattern corresponding to the coil pattern in the inner layer.

4. The printed circuit board with integrated coil according to claim 3,
wherein the thermal inter-layer connector comprises a plurality of the first thermal inter-layer connection members and a plurality of the second thermal inter-layer connection members, and
wherein a total volume of the plurality of second thermal inter-layer connection members is larger than a total volume of the plurality of first thermal inter-layer connection members.

5. The printed circuit board with integrated coil according to claim 3,
wherein a number of the second thermal inter-layer connection members is greater than a number of the first thermal inter-layer connection members.

6. The printed circuit board with integrated coil according to claim 3,
wherein the first thermal inter-layer connection member and the second thermal inter-layer connection member are formed of a columnar body, and
wherein a diameter of the second thermal inter-layer connection member is greater than a diameter of the first thermal inter-layer connection member.

7. The printed circuit board with integrated coil according to claim 1,
wherein the plurality of layers comprises at least a front-side outer surface layer and a back-side outer surface layer,
wherein the coil patterns comprise a front-side coil pattern provided in the front-side outer surface layer and a back-side coil pattern provided in the back-side outer surface layer,
wherein the heat-dissipation pattern comprises back-side heat-dissipation patterns provided in the back-side outer surface layer so as to correspond to the front-side coil pattern provided in the front-side outer surface layer,
wherein the back-side heat-dissipation patterns are separated from each other, and the back-side heat-dissipation patterns and the back-side coil pattern provided in the back-side outer surface layer are separated from each other,
wherein the thermal inter-layer connector comprises a plurality of thermal inter-layer connection members which connect the front-side coil pattern provided in the front-side outer surface layer and the back-side heat-dissipation patterns in the back-side outer surface layer which correspond to each other, and wherein a total area of the front-side coil pattern in the front-side outer surface layer and the back-side heat-dissipation patterns in the back-side outer surface layer corresponding to the front-side coil pattern is larger than an area of the back-side coil pattern in the back-side outer surface layer.

8. The printed circuit board with integrated coil according to claim 1,
wherein the plurality of layers comprises a front-side outer surface layer and a back-side outer surface layer,
wherein the coil patterns comprise a front-side coil pattern provided in the front-side outer surface layer and a back-side coil pattern provided in the back-side outer surface layer,
wherein the heat-dissipation pattern comprises:
   a first heat-dissipation pattern formed of a conductor and provided in the back-side outer surface layer so as to correspond to the front-side coil pattern of the front-side outer surface layer; and
   a second heat-dissipation pattern which is formed of a conductor, which is connected to the back-side coil pattern of the back-side outer surface layer, and which is provided in the back-side outer surface layer,
wherein the first heat-dissipation pattern, and the back-side coil pattern and the second heat-dissipation pattern of the back-side outer surface layer are separated from each other,
wherein the thermal inter-layer connector comprises a plurality of the thermal inter-layer connection members which connect the front-side coil pattern provided in the front-side outer surface layer and the first heat-dissipation pattern which correspond to each other, and
wherein an area of the first heat-dissipation pattern is larger than an area of the second heat-dissipation pattern.

9. A magnetic device comprising:
the printed circuit board with integrated coil according to claim 1; and
a core which is formed of a magnetic substance and passes through the printed circuit board with integrated coil,
wherein the coil patterns are formed in a plurality of layers in the printed circuit board with integrated coil so as to be wound around the core.

10. The magnetic device according to claim 9,
wherein a heat radiator is provided on the outer surface layer comprising the heat-dissipation pattern of the printed circuit board with integrated coil.

* * * * *